(12) United States Patent
Hirabayashi

(10) Patent No.: US 6,358,759 B1
(45) Date of Patent: Mar. 19, 2002

(54) METHOD FOR MANUFACTURING ELECTRO-OPTICAL DEVICE, ELECTRO-OPTICAL DEVICE, AND ELECTRONIC EQUIPMENT

(75) Inventor: Yukiya Hirabayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/610,879

(22) Filed: Jul. 6, 2000

(30) Foreign Application Priority Data

Jul. 16, 1999 (JP) .......................................... 11-203636

(51) Int. Cl.⁷ .............................................. H01L 21/00
(52) U.S. Cl. ............................................ 438/7; 438/69
(58) Field of Search ............................. 438/7, 30, 149, 438/151, 158, 164, 977, 69, 116, 459, 659

(56) References Cited

U.S. PATENT DOCUMENTS 5,672,518 A * 9/1997 Hayashi et al. ............. 438/164
6,066,860 A * 5/2000 Katayama et al. ............... 29/4
6,232,142 B1 * 5/2001 Yasukawa ..................... 438/69

FOREIGN PATENT DOCUMENTS

JP          10-293320          11/1998

* cited by examiner

Primary Examiner—David Nelms
Assistant Examiner—Phuc T. Dang
(74) Attorney, Agent, or Firm—Oliff & Berridge, PLC

(57) ABSTRACT

A electro-optical device and manufacturing method are provided for an electro-optical device that has the step of forming a light shielding layer on one side of a light transmissive substrate, patterning the light shielding layer, forming an insulating layer on the patterned light shielding layer, planarizing the insulating layer, bonding a model crystalline silicon layer on the surface of the planarized insulating layer, and forming a transistor element from the monocrystalline silicon layer, wherein the patterned light shielding layer is arranged in an area facing the transistor element and in a peripheral area surrounding the transistor element.

13 Claims, 16 Drawing Sheets

NO-TRANSISTOR-ELEMENT REGION

TRANSISTOR-ELEMENT FORMATION REGION

NO-TRANSISTOR-ELEMENT REGION

TRANSISTOR-ELEMENT FORMATION REGION

NO-TRANSISTOR-ELEMENT REGION    TRANSISTOR-ELEMENT FORMATION REGION

METHOD FOR MANUFACTURING ELECTRO-OPTICAL DEVICE, ELECTRO-OPTICAL DEVICE, AND ELECTRONIC EQUIPMENT

BACKGROUND OF THE INVENTION

1. Field of the Invention

The present invention relates to a method for manufacturing an electro-optical device having a light transmissive substrate and a monocrystalline layer bonded to the substrate, the electro-optical device and electronic equipment. In particular, the present invention relates to a method for manufacturing an electro-optical device having a light shielding layer formed on a light transmissive substrate, the electro-optical device and electronic equipment.

2. Description of the Related Art

The SOI technology in which a seminconductor device is formed on a silicon thin film on top of an insulating substrate is appropriate for use in an electro-optical device such as a liquid-crystal display device, because the SOI technology offers high-speed, low-power consumption features and the high degree of integration in devices.

When the SOI technology is applied to the electro-optical device, a monocrystalline silicon substrate is bonded to a light transmissive substrate, and is polished to form a thin monocrystalline silicon layer. Then, a transistor element such as a MOSFET for driving a liquid crystal is formed from the monocrystalline silicon layer.

In a projection-type display apparatus such as a projector employing a liquid-crystal display device, light is typically incident on the surface of a light transmissive substrate. The projection-type display apparatus is thus typically provided with a light shielding layer on a MOSFET to prevent a leakage photocurrent from entering a channel region of the MOSFET formed on the substrate.

Even if the light shielding layer is arranged on top of the MOSFET, light incident on the front surface is reflected from the back surface of the substrate, returns to and enters the channel region of the MOSFET, when a support substrate is light transmissive. Although the returning light is a mere fraction of the light quantity of light incident on the surface of the substrate, it is strong enough to cause a leakage photocurrent in an apparatus, such as a projector, which handles a high-power light source. The returning light from the back surface adversely affects the switching characteristics of the element, thereby degrading the device characteristics. Here, the surface having the monocrystalline silicon layer formed thereon is referred to as the front surface of the substrate, and the opposite surface thereof is referred as the back surface.

Japanese Unexamined Patent Application Publication No. 10-293320 discloses a technique for forming a light shielding layer on the surface of a substrate in an area corresponding to a transistor element. In such a technique, the light shielding layer is patterned on the surface of the substrate, an insulating layer is deposited on the light shielding layer and is then planarized, and a monocrystalline silicon substrate is then bonded onto the planarized surface.

SUMMARY OF THE INVENTION

Since such a liquid-crystal display device includes, on the substrate thereof, an area where transistor elements are concentrated and an area where no transistor elements are present, the light shielding layers are accordingly distributed on the substrate. Similarly, protrusions of the insulating layer prior to a polishing process are densely distributed in one area while sparsely distributed in the other area on the substrate. In the polishing process for planarizing the insulating layer, variations take place in polishing performance between the area of densely distributed protrusions and the area of sparsely distributed protrusions. Specifically, the thickness of the insulating layer becomes thick in the area of the densely distributed protrusions, while the thickness of the insulating layer becomes thin in the area of the sparsely distributed protrusions. As a result, the insulating layer suffers from waviness in the surface thereof subsequent to the polishing process.

If the insulating layer suffers from the waviness on the surface thereof, the following problems arise. First, a void is caused in the interface with the insulating layer and the monocrystalline silicon layer, and the MOSFET formed in the void suffers from poor performance characteristics or suffers from a complete failure. Second, the bond between the insulating layer and the monocrystalline silicon layer is weakened. A weakened bond in the MOSFET forming process subsequent to the formation of the monocrystalline silicon layer, causes a failure such as a peel of the monocrystalline silicon layer thereby decreasing the production yield of the device.

To resolve the above problems, the present invention has been developed. It is an object of the present invention to provide a method for manufacturing an electro-optical device that planarizes an insulating layer to which a monocrystalline silicon layer is bonded, the electro-optical device and electronic equipment.

Means for Solving the Problem

To achieve the above object, a method for manufacturing an electro-optical device of the present invention includes the step of forming a light shielding layer on one side of a light transmissive substrate, patterning the light shielding layer, forming an insulating layer on the patterned light shielding layer, planarizing the insulating layer, bonding a monocrystalline silicon layer on the surface of the planarized insulating layer, and forming a transistor element from the monocrystalline silicon layer, wherein the patterned light shielding layer is arranged in an area facing the transistor element and in a peripheral area surrounding the transistor element.

In accordance with the manufacturing method of the present invention, the light shielding layer formed on one side of the light transmissive substrate is present not in either the formation area of the transistor element or in the peripheral area of the transistor element, and variations of protrusions of the substrate due to the light shielding layer are reduced. A uniformity in the polishing rate on the substrate is substantially improved when the insulating layer on the light shielding layer is planarized through the polishing process. Through the planarizing process of the insulating layer, the surface of the light transmissive substrate is thus planarized to be flat without introducing waviness therein. No void occurs in the interface between the insulating layer and the monocrystalline silicon layer, the bond between the insulating layer and the monocrystalline silicon layer increases, and the transistor element is thus free from variations in performance characteristics and failures.

In accordance with the present invention, the light transmissive substrate is bonded to a counter substrate by a sealing member, and the peripheral area area facing the sealing member. Since the light shielding layer is arranged facing the sealing member, the peripheral area is uniformly planarized, and the monocrystalline silicon layer is well bonded.

In the method of the present invention for manufacturing an electro-optical device, the step of planarizing the insulating layer formed on the light transmissive substrate uses a chemical mechanical polishing process.

An electro-optical device of the present invention includes a patterned light shielding layer formed on one side of a light transmissive substrate, a planarized insulating layer formed on the patterned light shielding layer, and a switching element formed on the planarized insulating layer, wherein the patterned light shielding layer is arranged in an area facing the transistor element and in a peripheral area surrounding the transistor element.

In accordance with the present invention, the surface of the insulating layer is thus planarized to be flat. No void occurs in the interface between the insulating layer and the monocrystalline silicon layer. An electro-optical device features a strong bond between the insulating layer and the monocrystalline silicon layer, with the transistor element free from variations in the performance characteristics and failures.

In the electro-optical device of the present invention, the pattern of the light shielding layer in an area having no transistor element therewithin extends in a pattern that is developed by two-dimensionally periodically repeating a pattern formed in an area where a transistor element is arranged.

Since the protruded state of the surface of the insulating layer in the area where no transistor elements are formed is similar to the protruded state of the transistor formation area before planarization in this arrangement of the present invention, uniformity in the polishing rate is improved, and surface waviness is reduced prior to the planarizing process. No void occurs in the interface between the insulating layer and the monocrystalline silicon layer. An electro-optical device features a strong bond between the insulating layer and the monocrystalline layer with the transistor element free from variations in the characteristics and failures.

In the electro-optical device of the present invention, the light transmissive substrate is fabricated of quartz, and the light shielding layer is fabricated of a refractory metal or a refractory metal-silicide. In the transistor formation process on the light shielding layer, a heat treatment above 1000° C. can be performed to improve the device performance characteristics.

A method for manufacturing an electro-optical device of the present invention including a display area including on a transparent substrate a matrix of pixel electrodes and transistors connected to the respective pixel electrodes, an external-circuit interconnect terminal for receiving a signal from a drive circuit, an external-circuit arranged in a peripheral area surrounding the display area, including the steps of forming a light shielding layer on the transparent substrate, patterning the light shielding layer, forming an insulating layer on the patterned light shielding layer, planarizing the insulating layer, bonding a monocrystalline silicon layer on the surface of the planarized insulating layer, and forming a transistor element from the monocrygtalline silicon layer, wherein the patterned light shielding layer is arranged in an area of the transistor element and in an area peripheral thereto, and the light shielding layer in the peripheral area is arranged to face the drive circuit.

In accordance with the manufacturing method of the present invention, the pattern of the light shielding layer is present both in the formation area of the transistor element and in the peripheral area of the transistor element, and variations in the distribution of protrusions of the substrate due to the light shielding layer are small. A uniformity in the polishing rate on the substrate is substantially improved when the insulating layer on the light shielding layer is planarized through the polishing process. Since the peripheral area is easy to polish during the planarizing process, arranging the light shielding layer in the peripheral area reduces the variations in the distribution of protrusions in the substrate. No void occurs in the interface between the insulating layer and the monocrystalline silicon layer, the bond between the insulating layer and the monocrystalline silicon layer is increased, and the transistor element is thus free from variations in the performance characteristics and failures. Additionally, by arranging the light shielding layer in the area facing the drive circuit, no light is permitted to enter the drive circuit, and the transistor formed in the drive circuit is free from erratic operations.

In the method for manufacturing an electro-optical device of the present invention, the patterned light shielding layer is arranged in an area facing the external-circuit interconnect terminal.

In accordance with the manufacturing method of the present invention, the waviness is controlled through the planarizing process of the insulating layer, because the light shielding layer is arranged in the area facing the external-circuit interconnect terminal.

A method for manufacturing an electro-optical device of the present invention including a display area, includes a transparent substrate a matrix of pixel electrodes and transistors connected to the respective pixel electrodes, an external-circuit interconnect terminal for receiving a signal from a drive circuit, an external-circuit arranged in a peripheral area surrounding the display area, including the steps of forming a light shielding layer on the transparent substrate, patterning the light shielding layer, forming an insulating layer on the patterned light shielding layer, planarizing the insulating layer, bonding a monocrystalline silicon layer on the surface of the planarized insulating layer, and forming a transistor element from the monocrystalline silicon layer, wherein the patterned light shielding layer is arranged in an area of the transistor element and in an area peripheral thereto, and the light shielding layer in the peripheral area is arranged in the vicinity of the drive circuit and the external-circuit interconnect terminal but not arranged in an area facing the drive circuit.

Since the light shielding layer in accordance with the manufacturing method of the present invention, is formed in the peripheral area surrounding the drive circuit and the external-circuit interconnect terminal variations in the distribution of the protrusions of the insulating layer thereon are reduced. Since no light shielding layer is arranged in the area facing the drive circuit and the external-circuit interconnect terminal, the electrical effect caused by the light shielding layer is limited.

In accordance with the method for manufacturing an electro-optical device of the present invention, the step of planarizing the insulating layer uses a chemical mechanical polishing process.

In accordance with the manufacturing method of the present invention, the light shielding layer is formed in the display area and the peripheral area, and the insulating layer is deposited on the light shielding layer. The peripheral area is planarized with less waviness involved.

In accordance with the method for manufacturing an electro-optical device of the present invention, the light shielding layer arranged in an area facing the transistor and the light shielding layer arranged in an area facing the drive circuit have generally identical shapes.

Since the light shielding layer arranged in the area facing the transistor and the light shielding layer arranged in the area facing the drive circuit have generally identical shapes in accordance with the manufacturing method of the present invention, the spacings between the light shielding layers become substantially uniform, and the degree of waviness is further reduced through the planarizing process of the insulating layer thereon.

An electro-optical device of the present invention further includes the other light transmissive substrate which is arranged opposite from the surface of the light transmissive substrate having the monocrystalline silicon layer thereon, a liquid crystal interposed between the two light transmissive substrates, and driven by a transistor element formed within the transistor.

Electronic equipment of the present invention includes a light source, an electro-optical device described above, for modulating a light beam entering thereon from the light source in response to image information, and projection means for projecting modulated light beam from the electro-optical device.

DESCRIPTION OF THE EMBODIMENTS

Figure 1:
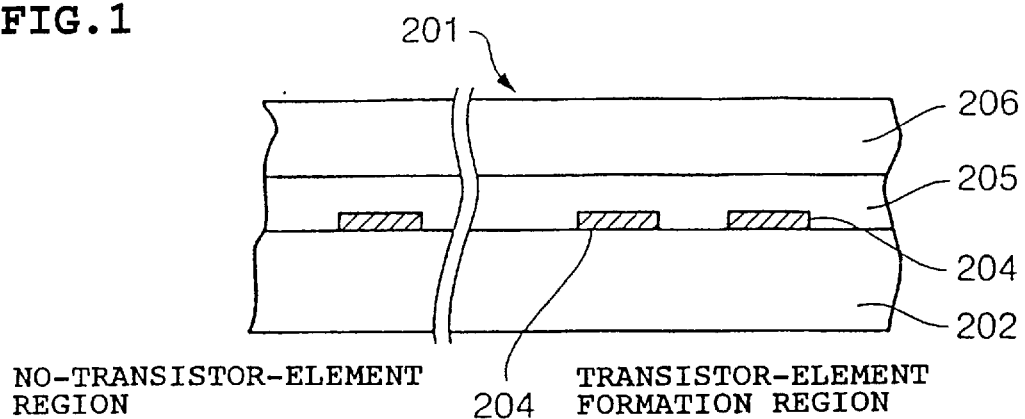
FIG. 1 is a cross-sectional view showing the basic construction of a liquid-crystal display device of the present invention.

The embodiments of the present invention are now discussed, referring to the drawings.

(Basic Construction of the Electro-optical Device)

FIG. 1 is a cross-sectional view showing the basic construction of the electro-optical device of a first embodiment of the present invention.

Referring to FIG. 1, an electro-optical device 201 includes a light shielding layer 204 formed on a light transmissive substrate (transparent substrate) 202. An insulating layer 205 and a monocrystalline silicon layer 206 are successively formed on the light transmissive substrate 202. A transistor element formation region (not shown) is formed in the monocrystalline silicon layer 206 in a position corresponding to the light shielding layer 204.

(Manufacturing Process)

Figure 2:
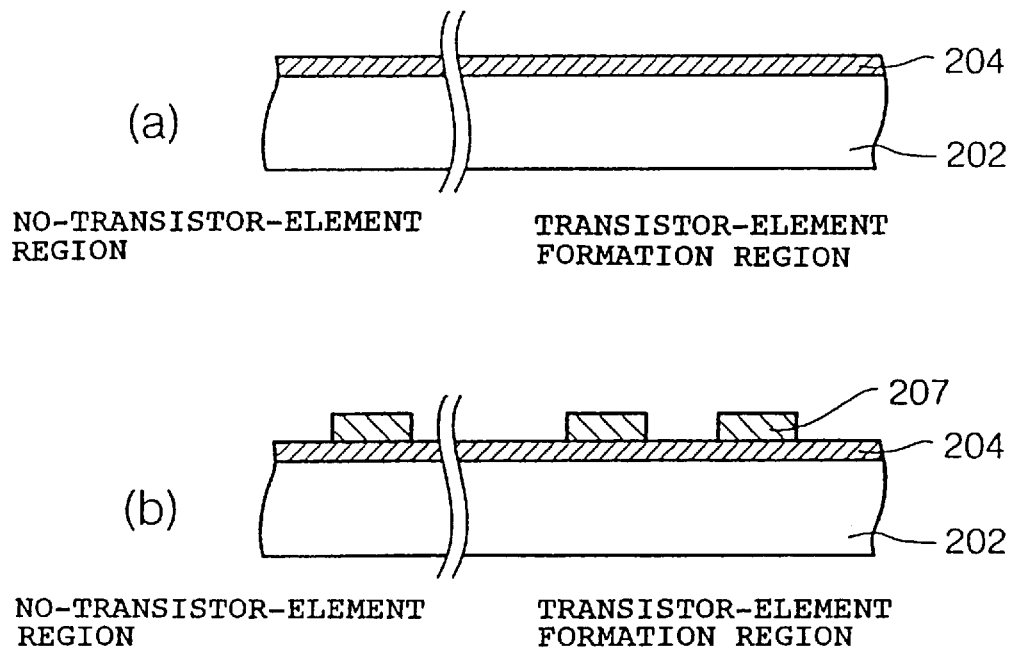
FIG. 2 showing steps (a)–(b) are process diagrams showing the manufacturing process of the liquid-crystal display device of FIG. 1.
Figure 4:
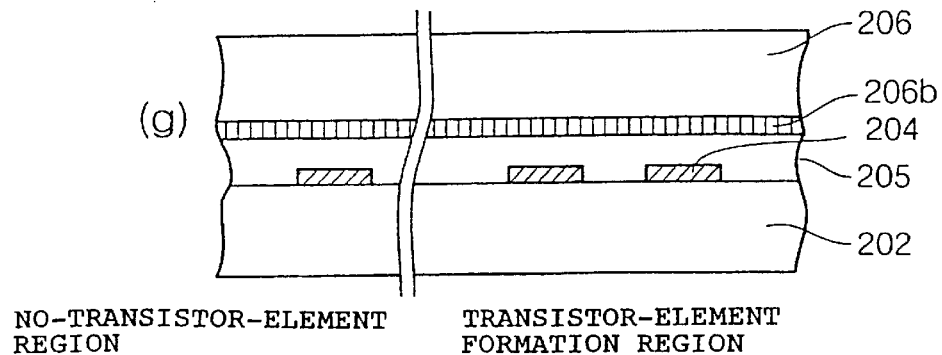
FIG. 4 showing step (g) is a process diagram showing the manufacturing process of the liquid-crystal display device of FIG. 1.

The manufacturing process of the above electro-optical device is now discussed, referring to FIG. 2 step (2) through FIG. 4 step (g)

Referring to FIG. 2 step (2), the light shielding layer 204 is formed on the entire top surface of the transparent light transmissive substrate 202. The light transmissive substrate 202 is fabricated of quartz at thick as 1.2 mm, for instance. The light shielding layer 204 is formed by depositing molybdenum to a thickness within a range from 100 to 250 nm, preferably to a thickness of 200 nm, through the sputtering technique. In this embodiment, the material of the light shielding layer 204 is not limited to molybdenum, and any material is acceptable as long as it is stable under a highest temperature in a thermal process of device manufacturing. For instance, preferred materials include refractory metals such as tungsten, or tantalum, polycrystalline silicon, and suicides such as tungsten silicide or molybdenum silicide. Besides the sputtering technique, other technique such as the CVD or the electron beam deposition may be used.

Referring to FIG. 2 step (b), a photoresist pattern 207 is formed. The photoresist pattern 207 is formed both in a position corresponding to the transistor-element formation region, and in a no-transistor-element region (a peripheral area of the transistor element). Specifically, the no-transistor-element region refers to a sealing area where a sealing material is applied for gluing a counter substrate, a peripheral area of a drive circuit for driving a data line and a scanning line, and a terminal-pad area forming interconnect terminals for connecting to input/output signal lines; each present in the peripheral area surrounding the transistor-element formation region.

Figure 3:
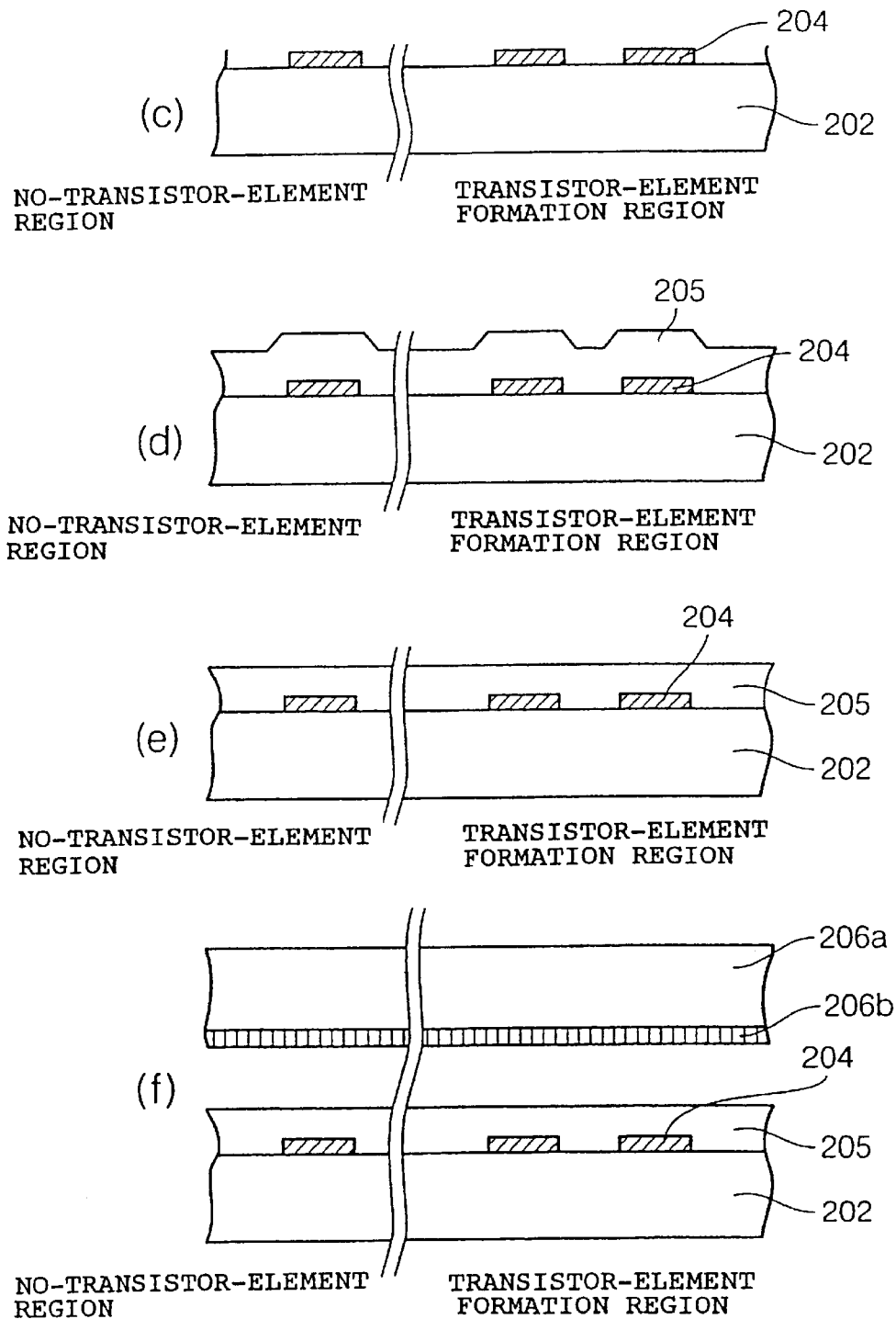
FIG. 3 showing steps (c)–(f) are process diagrams showing the manufacturing process of the liquid-crystal display device of FIG. 1.

Referring to FIG. 3 step (c), the light shielding layer 204 is etched with the photoresist pattern 207 serving as a mask, and the pattern of the light shielding layer 204 is formed on the light transmissive substrate 202. The photoresist pattern 207 is then peeled off.

Referring to FIG. 3 step (d), insulating layer 205, fabricated of oxide silicon, is deposited. The oxide silicon layer is deposited to a thickness of 1000 nm or so through the sputtering technique or the plasma CVD using TEOS (tetraethylorthosilicate). Instead of the silicon oxide film, the insulating layer 205 may be fabricated of highly insulating glass such as NSG (non-doped silicate glass), PSG (phosphosilicate glass), BSG (borosilicate glass), BPSG (borophosphosilicate glass) or a silicon nitride film.

Referring to FIG. 3 step (e) the surface of the insulating layer 205 is planarized by globally polishing the insulating layer 205 to leave a predetermined thickness thereof on the light shielding layer 204. A chemical mechanical process (CMP) may be used as the technique for a planarizing polishing process.

Referring to FIG. 3 step (f) a monocrystalline silicon substrate 206a is bonded to the light transmissive substrate 202. The thickness of the monocrystalline silicon substrate 206a to be bonded is approximately 300 mm. The monocrystalline silicon substrate 206a on the surface thereof is beforehand oxidized to a depth of 0.05 to 0.8 mm, thereby forming an oxide layer 206b. The interface formed, before the bonding, between the monocrystalline silicon layer 206 and the oxide layer 206b is thermally oxidized, to assure an electrically conductive interface. In the bonding process, the two substrates may be bonded in a thermal process under a temperature of 300° C. for two hours. To further increase the bonding strength, the temperature of the thermal process needs to be heightened to approximately 450° C. However, there is a large difference between thermal expansion coefficients of the quartz substrate and the monocrystalline silicon substrate. If the laminate is heated as is, the monocrystalline silicon substrate may crack, degrading the quality thereof. To control the generation of defects such as a crack, the monocrystalline silicon substrate is subjected to wet etching or CMP which reduces the thickness thereof to within a range from 100 to 150 mm subsequent to the thermal process for bonding under a temperature of 300° C., and is then subjected a high-temperature thermal process. For instance, the monocrystalline silicon substrate is etched to a thickness of 150 mm in a solution of KOH at a temperature of 80° C., and then, the bonded substrates are subjected to a thermal process under a temperature of 450° C. to increase the bonding strength.

Referring to FIG. 4 step (g), the bonded substrates are polished until the thickness of the monocrystalline silicon layer 206 falls within a range from 3 to 5 mm.

The thinned laminate of the bonded substrates is then etched through a PACE (Plasma Assisted Chemical Etching) technique until the thickness of the monocrystalline silicon layer 206 falls within a range of 0.05 to 0.8 mm. Through the PACE process, the monocrystalline silicon layer 206 has reduced any thickness variations to within 10% relative to a thickness of 100 mm.

Besides the PACE process, the techniques available for obtaining a thinned monocrystalline silicon layer, may be, for example, a method of splitting a monocrystalline silicon substrate through a thermal process bonding the hydrogen-ion implanted monocrystalline silicon substrate, or an ELT-RAN (Epitaxial Layer Transfer) method of transferring an epitaxial silicon layer formed on porous silicon to a bonded substrate through a selective etching of the porous silicon layer.

In the manufacturing process of this embodiment, the light shielding layer 204 is formed on the light transmissive substrate 202, not only in the transistor-element formation area but also in the peripheral area surrounding the transistor element. The variations in the distribution of protrusions of the substrate due to the light shielding layer are reduced. A uniformity in the polishing rate on the substrate is substantially improved when the insulating layer on the light shielding layer is planarized through the polishing process.

Referring to the polishing step in FIG. 3 step (e), the surface of the insulating layer 205 is planarized. No void occurs in the interface between the insulating layer 205 and the monocrystalline silicon layer 206, and the bond between the insulating layer 205 and the monocrystalline layer 206 is increased, creating a transistor element that is free from variations in performance characteristics and failures.

(Construction of the Electro-optical Device Manufactured Through the Process of the Embodiment)

Figure 5:
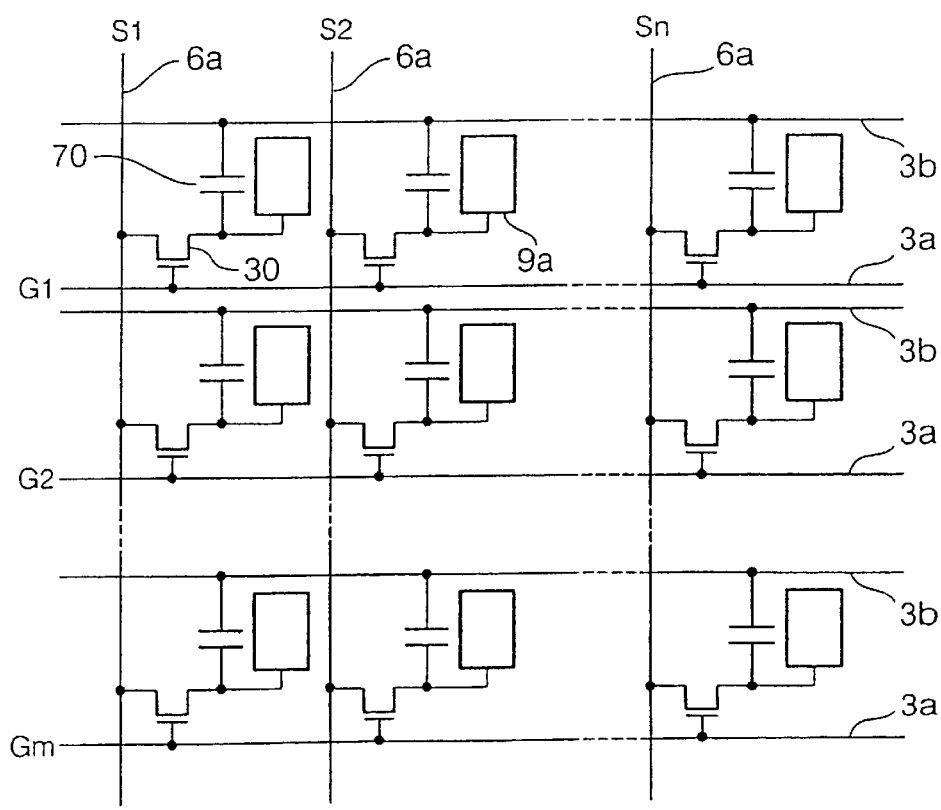
FIG. 5 is an equivalent circuit diagram of a variety of elements and lines in a matrix of pixels forming an image forming area in one embodiment of the present invention.
Figure 6:
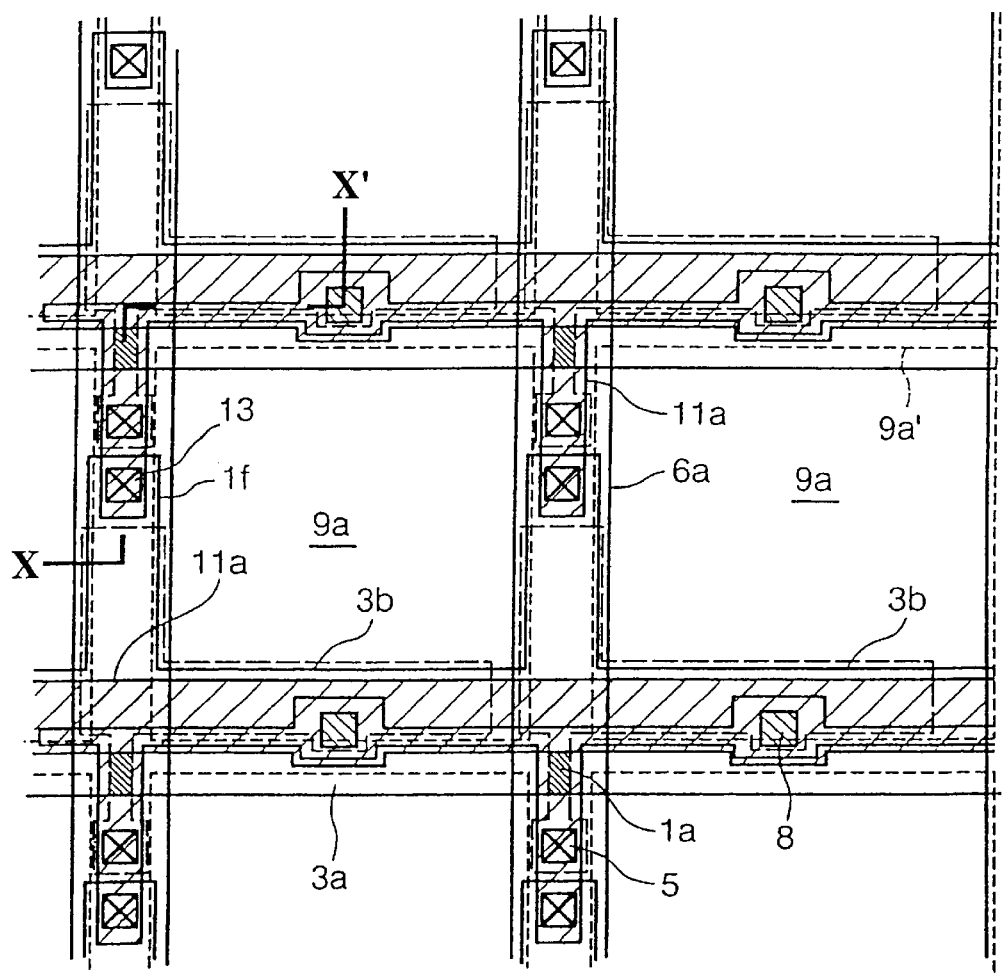
FIG. 6 is a plan view of a plurality of adjacent pixel groups in an TFT array substrate in which data lines, scanning lines, pixel electrodes, light shielding layers, etc are formed in one embodiment of the present invention.
Figure 7:
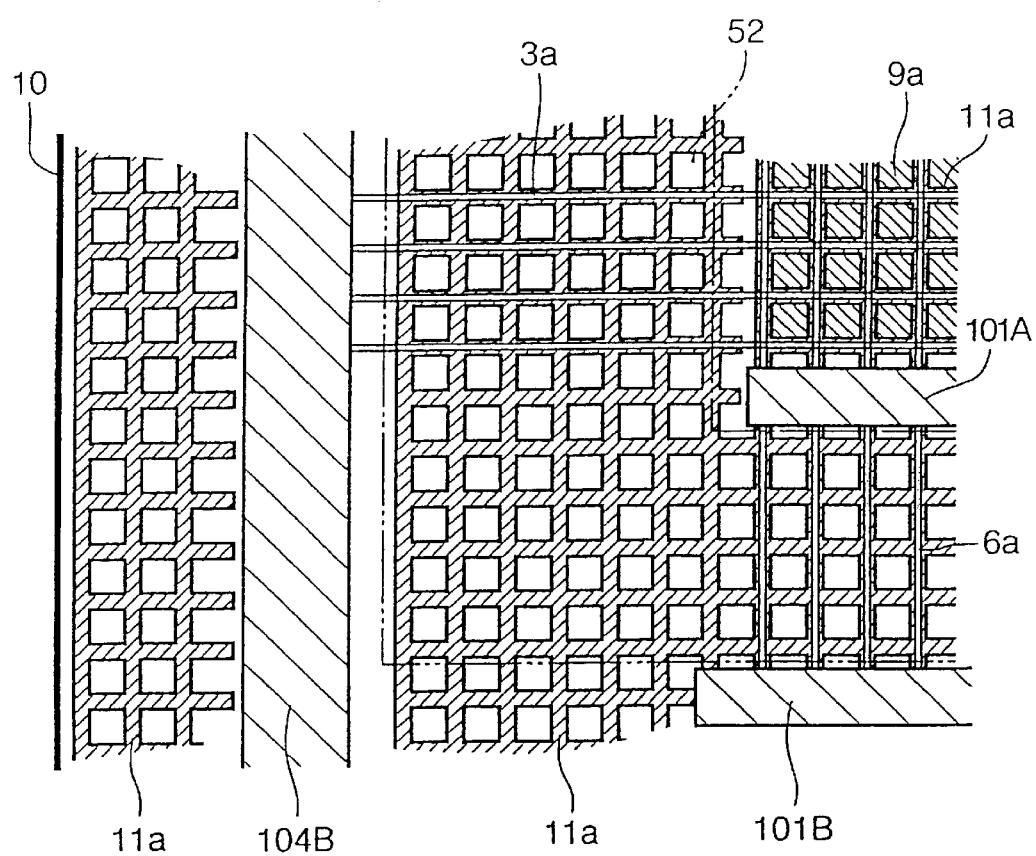
FIG. 7 is a plan view showing the construction of the peripheral area of the pixel matrix in the TFT array substrate in one embodiment of the present invention.
Figure 8:
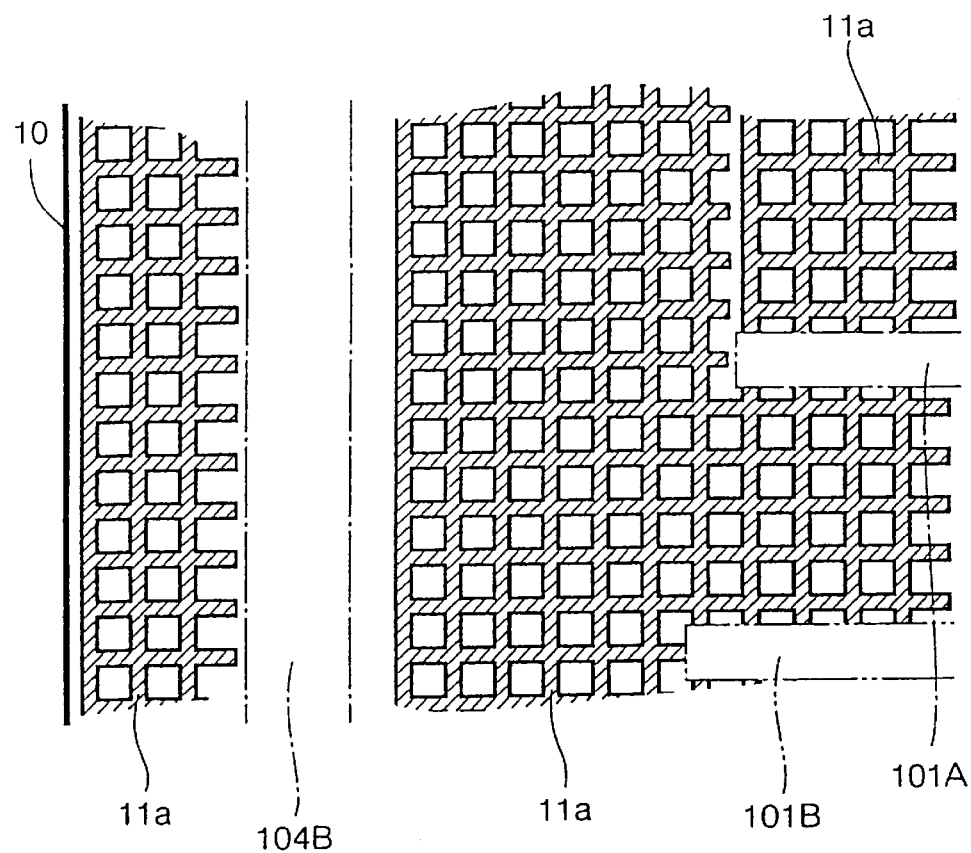
FIG. 8 is a plan view showing the construction of the peripheral area of the pixel matrix in the TFT array substrate in one embodiment of the present invention.
Figure 9:
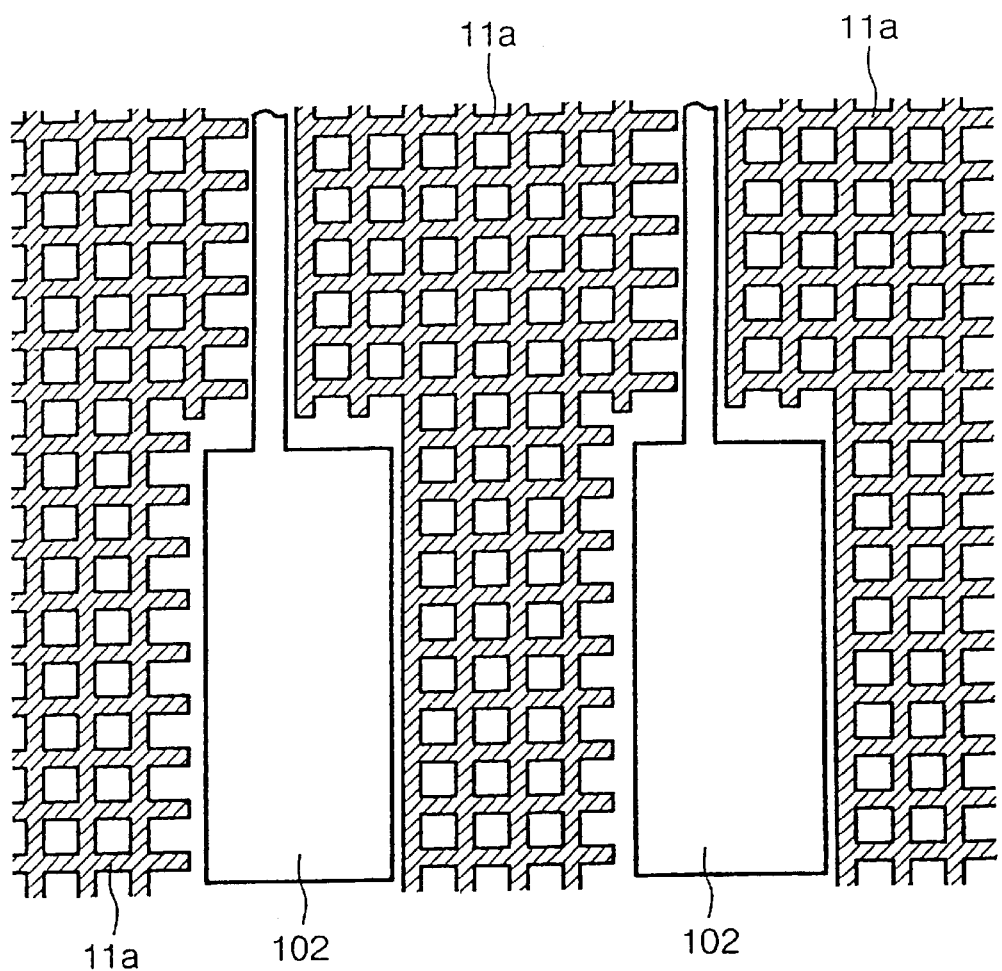
FIG. 9 is a plan view showing the construction of the peripheral area of the pixel matrix in the TFT array substrate in one embodiment of the present invention.
Figure 10:
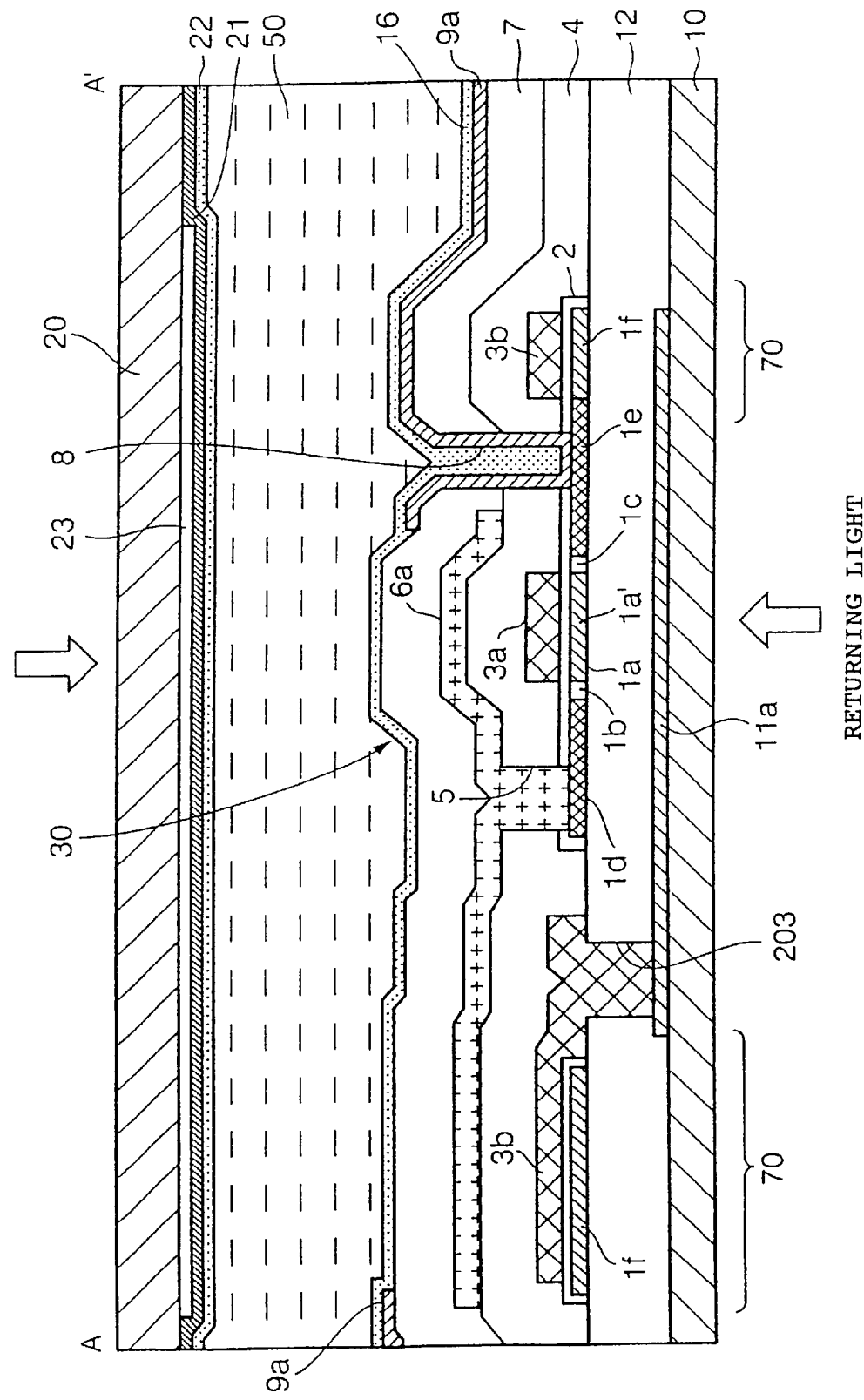
FIG. 10 is a cross-sectional view of the TFT array substrate taken along line X-X' in FIG. 6.

FIG. 5 is an equivalent circuit diagram of a variety of elements and lines in a plurality of pixels arranged in a matrix, constituting an image display area (pixel matrix area) of a liquid-crystal display device as an electro-optical device. FIG. 6 is an enlarged plan view showing a plurality of pixel groups composed of a plurality of adjacent pixels in a TFT array substrate bearing a data line, a scanning line, a pixel electrode, etc., and FIG. 7 through FIG. 9 are plan views showing the construction of the area peripheral to the pixel matrix area of the TFT array substrate. FIG. 10 is a cross-sectional view of the TFT array substrate taken along line A-A' in FIG. 6. In FIG. 10, layers and members are drawn in different scales to present them distinctly visible in figures.

Referring to FIG. 5, the plurality of the pixels arranged in a matrix constituting the image display area (the pixel matrix area) of the electro-optical device of this embodiment include pixel electrodes 9a and TFTs (transistor elements) 30 for controlling the respective pixel electrodes 9a, arranged in a matrix, and data lines 6a carrying a image signal are respectively electrically connected to the source regions of the TFTs 30. Image signals S1, S2, . . . , Sn may be supplied on the data lines 6a in a one-line-at-a-time manner in that order, or may be supplied to a group of adjacent data lines 6a at a time on a group-by-group basis. Scanning lines 3a are respectively electrically connected to the gates of the TFTs 30 and are supplied with scanning signal G1, G2, . . . , Gm in the form of pulse at a predetermined timing in a one-line-at-a-time manner in that order. Pixel electrodes 9a are respectively electrically connected to the drain regions of the TFTs 30, and the image signals S1, S2, . . . , Sn fed through the data lines 6a are written at a predetermined timing by closing the TFTs 30, as a switching element, for a predetermined duration of time. The image signals S1, S2, . . . , Sn at a predetermined level, which are written on a liquid crystal through the pixel electrodes 9a, are stored in the liquid crystal for a predetermined duration of time with a counter electrode (to be discussed later) formed on a counter substrate (to be discussed later). The liquid crystal modulates light to present it in a gradation by varying the orientation or the order of the collection of molecules. In a normally white mode, incident light is not transmitted through the liquid crystal depending on a voltage applied, while in a normally black mode, the incident light is transmitted through the liquid crystal depending on a voltage applied, and as a result, the liquid-crystal display device outputs light bearing a contrast responsive to the image signal. To prevent the stored image signal from leaking, a storage capacitor 70 is added in parallel with the capacitor of the liquid crystal formed between the pixel electrode 9a and the counter electrode. For instance, the voltage of the pixel electrode 9a is stored in the storage capacitor 70 for a period of time three orders of magnitude longer than the time during which the voltage is applied to the data line. In this way, the storage characteristics of the pixel are improved, resulting in a high-contrast-ratio liquid-crystal display device. In this embodiment, the storage capacitor 70 is constructed of a low-resistance capacitance line 3b which is formed of the same layer as that for the scanning line or of the electrically conductive, light shielding layer.

Referring to FIG. 6, the plan layout of the pixel matrix area (image display area) of the TFT array substrate. As shown in FIG. 6, a matrix of transparent pixel electrodes 9a (the peripheral outline of which is represented by broken lines 9a') is arranged on the TFT array substrate of the liquid-crystal display device, and the data line 6a, the scanning line 3a, and the capacitance line 3b extend along the vertical and horizontal borders between the pixel electrodes 9a. The data line 6a is electrically connected to the source region, to be discussed later, of a semiconductor layer 1a fabricated of a polysilicon layer, through a contact hole 5. The pixel electrode 9a is electrically connected to the drain region, to be discussed later, of the semiconductor layer 1a through a contact hole 8. The scanning line 3a is arranged to face a channel region (represented by an area hatched with rightwardly upwardly rising lines as shown) of the semiconductor layer 1a, and functions as a gate electrode.

The capacitance line 3b includes a main line portion that extends substantially linearly along the scanning line 3a (specifically, a first portion formed along the scanning line 3a in a plan view) and a projecting portion that projects (upwardly as shown) along the data line 6a to a preceding stage from an intersection thereof with the data line 6a (specifically, a second portion extending along the data line 6a in a plan view).

A plurality of first light shielding layers 11a, corresponding to the light shielding layer 204 shown in FIG. 1, are arranged in the hatched areas with rightly upwardly rising lines. Specifically, each of the first light shielding layers 11a is arranged in a position for covering the TFT, including the channel region of the semiconductor layer 1a in the pixel matrix area. The first light shielding layer 11a includes a main line portion, facing the main line portion of the capacitance line 3b, and linearly extends along the scanning line 3a, and a projecting portion (downwardly as shown) to a subsequent stage along the data line 6a from an intersection thereof with the data line 6a. At the end of the downwardly aligned projecting portion of each stage (pixel row) of the first light shielding layer 11a is an area overlapping the end of the projecting portion of the capacitance line 3b of the subsequent stage beneath the data line 6a. In the overlapping area, a contact hole 13 for electrically connecting the first light shielding layer 11a and the capacitance line 3b is arranged. In this embodiment, the first light shielding layer 11a is electrically connected to the preceding or subsequent capacitance line 3b through the contact hole 13.

Although having the pixel electrode 9a and the TFT within the pixel matrix area only in this embodiment, the first light shielding layer 11a is arranged both within the pixel matrix area and external to the pixel matrix area, needing no light shielding (the peripheral area of the pixel matrix area), i.e., in a sealing area where a sealing material is applied for gluing a counter substrate, and a terminal-pad area forming interconnect terminals for connecting to input/output signal lines, in such a manner that a similar pattern is two-dimensionally developed. In this way, when the insulating layer formed on the first light shielding layer 11a is polished for planarization, the protruded state becomes uniform in the pixel matrix area and the peripheral area surrounding the pixel matrix area, thereby permitting the monocrystalline silicon layer to be stably bonded.

Referring to FIG. 7 through FIG. 9, the plan layout of the peripheral area surrounding the pixel matrix area in the TFT array substrate is now discussed in detail. FIG. 7 is a diagrammatic plan view showing, an area designated 300 in FIG. 17, to be discussed later, namely, a corner of the peripheral area of a sealing material 52. FIG. 8 is a diagrammatic plan view showing the first light shielding layer 11a of FIG. 7. FIG. 8 shows the substrate in the state prior to the formation of the semiconductor layer and the wiring. FIG. 9 is a diagrammatic plan view showing, an area designated 400 in FIG. 17, namely, a terminal-pad area in which an external-circuit interconnect terminal 102 is formed.

Referring to FIG. 7 through FIG. 9, the first light shielding layer 11a is shown in a gridlike configuration for simplicity. However, the first light shielding layer 11a is not a complete grid and is represented by rightwardly upwardly rising lines in FIG. 6. Referring to FIG. 7 and FIG. 8, reference numeral 10 designates the TFT array substrate.

Referring to FIG. 7, the pixel electrodes 9a, the data lines 6a, and the scanning lines 3a are arranged in the pixel matrix area within the sealing material 52, to be discussed later, as shown in FIG. 6. The first light shielding layer 11a is arranged about each pixel electrode 9a as represented by the rightwardly upwardly rising lines as shown in FIG. 6.

Referring to FIG. 7, shows one end of the data line 6a arranged within the pixel matrix area extending out of the pixel matrix area (downwardly as shown in FIG. 7), and electrically connected to a sample-and-hold circuit 101A and a data line shift register 101B, both constituting a data-line drive circuit 101. One end of the scanning line 3a arranged within the pixel matrix area extending out of the pixel matrix area (leftwardly as shown in FIG. 7), and is electrically connected to a scanning line shift register 104B constituting a scanning-line drive circuit 104.

Referring to FIG. 7 and FIG. 8, in this embodiment, shows the first light shielding layer 11a extending not only within the pixel matrix area, in the peripheral area surrounding the pixel matrix area, namely, in the sealing area where the sealing material 52 is applied, and in an area external to the sealing area, in the same pattern as that in the pixel matrix area.

Referring to FIG. 9, the first light shielding layer 11a, having the same pattern as that in the pixel matrix area, is formed on the TFT array substrate 10 in the terminal-pad area where the external-circuit interconnect terminal 102 is formed.

As shown in FIG. 7 through FIG. 9, the first light shielding layer 11a is not arranged right beneath the data-line drive circuit 101 (the sample-and-hold circuit 101A and the data line shift register 101B), the scanning-line drive circuit 104 (the scanning line shift register 104B), and the external-circuit interconnect terminal 102 for the following reason. If the first light shielding layer 11a, having electrical conductivity, is arranged right beneath one of the drive circuits 101 and 104 and the external-circuit interconnect terminal 102, the one of the drive circuits 101 and 104 and the external-circuit interconnect terminal 102 may be electrically affected by the first light shielding layer 11a even if an insulating layer is interposed between the first light shielding layer 11a and the one of the drive circuits 101 and 104 and the external-circuit interconnect terminal 102.

The number of the protrusions of the insulating layer on the first light shielding layer 11a is slightly larger when the first light shielding layer 11a is not formed right beneath the data-line drive circuit 101, the scanning-line drive circuit 104, and the external-circuit interconnect terminal 102, than when the first light shielding layer 11a is formed right therebeneath. This is not a problem, because the area occupied by the data-line drive circuit 101, the scanning-line drive circuit 104, and the external-circuit interconnect terminal 102 is merely a fraction of the overall area of the TFT array substrate 10.

However, if the electrical effect of the first light shielding layer 11a on the drive circuits 101 and 104 and the external-circuit interconnect terminal 102 is negligibly small, even with the first light shielding layer 11a arranged right beneath the drive circuits 101 and 104 and the external-circuit interconnect terminal 102, it is preferred that the first light shielding layer 11a be arranged right beneath the drive circuits 101 and 104 and the external-circuit interconnect terminal 102. In this case, the degree of waviness of the insulating layer on the first light shielding layer 11a is small compared with the case when the first light shielding layer 11a is not formed right beneath the drive circuits 101 and 104 and the external-circuit interconnect terminal 102.

Figure 17:
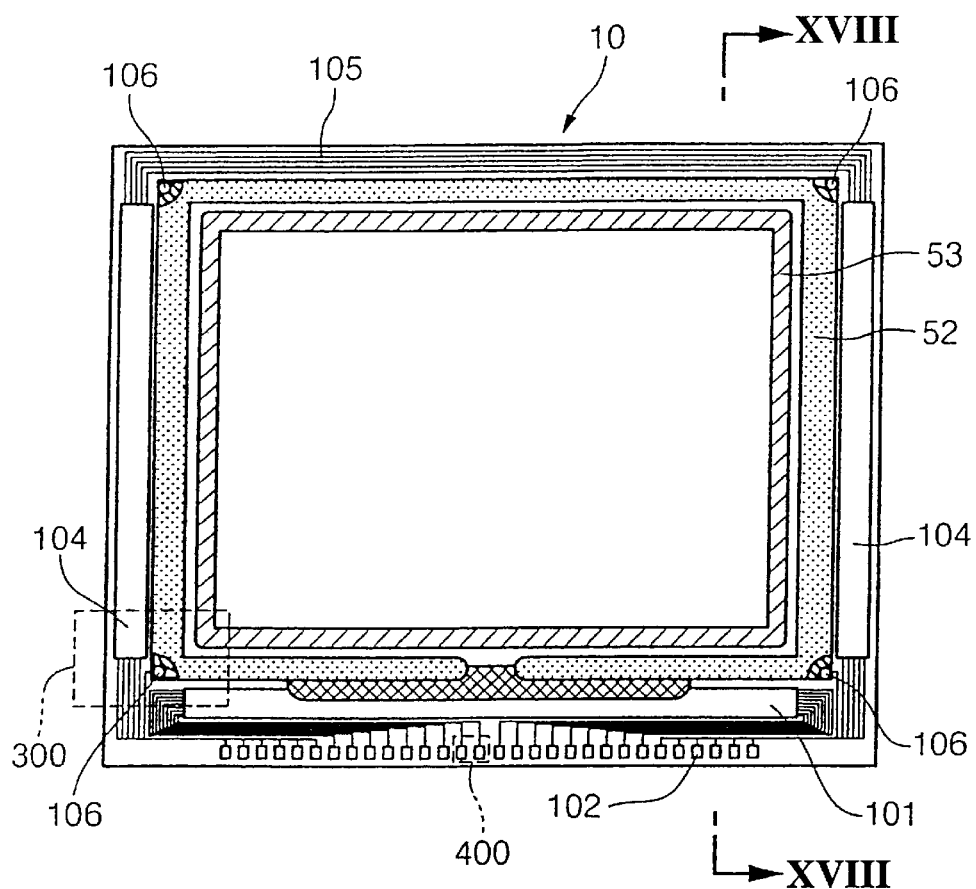
FIG. 17 is a plan view showing the TFT array substrate with components formed thereon, in one embodiment of a liquid-crystal display device, viewed from a counter substrate.

In this embodiment, represented by reference numerals 300 and 400 in FIG. 17, are shown as the peripheral area surrounding the pixel matrix area. The remaining peripheral area has the same constructions as shown in FIG. 7 through FIG. 9.

Referring to FIG. 10, a sectional construction of the pixel of the liquid-crystal display device is now discussed. As shown, the liquid-crystal display device includes the transparent TFT array substrate 10 constituting one example of the light transmissive substrate and a transparent counter substrate 20 opposed to the transparent TFT array substrate 10. The TFT array substrate 10 is fabricated of a quartz substrate, for instance, and the counter substrate 20 is fabricated of a glass substrate or a quartz substrate, for instance. The TFT array substrate 10 is provided with the pixel electrodes 9a, and on top is an alignment layer 16 which has been subjected to a rubbing process. The pixel electrode 9a fabricated of a transparent, electrically conductive film, such as an ITO (Indium Tin Oxide) film. The alignment layer 16 is fabricated of an organic thin film, such as a polyimide thin film.

The counter substrate 20 has a counter electrode (common electrode) 21 extending on the entire surface thereof, and an alignment layer 22 therebeneath that has been subjected to a rubbing process. The counter electrode 21 is fabricated of a transparent, electrically conductive film, such as an ITO film. The alignment layer 22 is fabricated of an organic thin film such as a polyimide thin film.

Arranged on the TFT array substrate 10 is a pixel switching TFT 30, adjacent to each pixel electrode 9a, for controlling the pixel electrode 9a as shown in FIG. 10.

Arranged on the counter substrate 20 is a second light shielding layer 23, in an area other than the aperture area in each pixel as shown in FIG. 10. For this reason, no incident light enters the channel region 1a', and LDDs (Lightly Doped Drain) regions 1b and 1c of the semiconductor layer 1a of the pixel switching TFT 30, from the counter substrate 20. The second light shielding layer 23 has the function of improving a contrast ratio, and the function of preventing color mixing of color materials.

A liquid crystal is encapsulated in a gap surrounded by a sealing material (not shown) between the TFT array substrate 10 and the counter substrate 20 arranged with the pixel electrodes 9a facing the counter electrode 21, and a liquid-crystal layer 50 is thus formed. The liquid-crystal layer 50 takes a predetermined orientation state by the alignment layer 16 and the alignment layer 22 with no electric field applied by the pixel electrode 9a. The liquid-crystal layer 50 is formed of a mixture of one or several types of nematic liquid crystals. The sealing material is an adhesive agent made of a thermal setting agent or a photo-setting agent for bonding the TFT array substrate 10 to the counter substrate 20 along the edges thereof, and is mixed with spacers such as glass fiber or glass beads to keep a predetermined distance between the two substrates.

Referring to FIG. 10, the first light shielding layer 11a is arranged on the TFT array substrate 10 in a position corresponding to the pixel switching TFT 30. The first light shielding layer 11a is preferably fabricated of a metal, a metal alloy or a metal silicide, including at least one selected from the group of opaque refractory metals consisting of Ti, Cr, W, Ta, Mo and Pb.

With the first light shielding layer 11a fabricated of one of these materials, the first light shielding layer 11 a is not damaged or melted through a high-temperature thermal process for forming the pixel switching TFT 30, subsequent to the formation step of the first light shielding layer 11a on the TFT array substrate 10. In this embodiment, the first light shielding layer 11a is formed on the TFT array substrate 10, light returning from the TFT array substrate 10 is prevented from entering the channel region 1a' and LDD regions 1b and 1c of the pixel switching TFT 30, and the pixel switching TFT 30 as a transistor element is free from degradation in performance characteristics due to leakage photocurrent in response to incident light.

A first interlayer insulator (insulating layer) 12 is provided between the first light shielding layer 11a and a plurality of pixel switching TFTs 30. The first interlayer insulator 12 is arranged to electrically isolate the semiconductor layer 1a of the pixel switching TFT 30 from the first light shielding layer 11a. The first interlayer insulator 12 is formed on the entire surface of the TFT array substrate 10, and is polished and planarized to eliminate the effect of the steps in the pattern of the first light shielding layer 11a.

The interlayer insulator 12 is fabricated of highly insulating glass such as NSG (non-doped silicate glass), PSG (phosphosilicate glass), BSG (borosilicate glass), BPSG (borophosphosilicate glass) or a silicon oxide film or a silicon nitride film. The use of the first interlayer insulator 12 prevents the first light shielding layer 11a from contaminating the pixel switching TFT 30.

In this embodiment, the gate insulator 2 extends from a position facing the scanning line 3a and is used as a dielectric layer, the semiconductor layer 1a extends forming a first storage capacitor electrode 1f, and a portion of the capacitance line 3b facing these becomes a second storage capacitor electrode. The storage capacitor 70 is thus formed.

More specifically, a heavily doped drain region 1e of the semiconductor layer 1a extends beneath the data line 6a and the scanning line 3a, and faces the capacitance line 3b extending along the data line 6a and the scanning line 3a, with the insulating layer 2 interposed therebetween, thereby forming the first storage capacitor electrode (semiconductor layer) 1f. The insulating layer 2, as a dielectric material of the storage capacitor 70, is the gate insulator 2 of the TFT 30 that is formed in the monocrystalline silicon layer through a high-temperature thermal process. The insulating layer 2 is thus thin and can withstand a high voltage. The storage capacitor 70 offers a high-capacitance storage capacitor with a relatively small area thereof.

It is clear from FIG. 6 and FIG. 10 that the storage capacitor 70 is constructed of the first light shielding layer 11a acting as a third storage capacitor electrode, opposed to the capacitance line 3b as the second storage capacitor electrode with respect to the first storage capacitor electrode 1f (see the storage capacitor 70 on the right portion of FIG. 10), with the first interlayer insulator 12 interposed therebetween. Specifically, this embodiment provides a double storage capacitor structure in which storage capacitors are arranged on both sides of the first storage capacitor electrode 1f. This arrangement improves the function of the liquid-crystal display device in the prevention of fluctuations during image presentation.

As a result, the space external to the aperture area and beneath the data line 6a, and an area where a disclination takes place in the liquid crystal along the scanning line 3a (i.e., a formation area of the capacitance line 3b), is effectively used, increasing the storage capacitor of the pixel electrode 9a.

In this embodiment, the first light shielding layer 11a (and the capacitance line 3b electrically connected thereto) is electrically connected to a constant voltage power source. The first light shielding layer 11a and the capacitance line 3b are thus maintained at a constant voltage. The pixel switching TFT 30, opposed to the first light shielding layer 11a, is thus free from any adverse effect arising from variations in the voltage of the first light shielding layer 11a. The capacitance line 3b excellently serves as the second storage capacitor electrode of the storage capacitor 70. Also, the constant voltage power source may be a negative-voltage power source for the peripheral circuits for driving the liquid-crystal display device (such as the scanning-line drive circuit and the data-line drive circuit), a constant-voltage power source such as a positive-voltage power source, ground potential, or a constant-voltage power source for the counter electrode 21. With the power source for the peripheral circuit employed, the first light shielding layer 11a and the capacitance line 3b are fixed to a constant voltage without the need for a dedicated voltage line or an input terminal connecting to an external-circuit.

Referring to FIG. 6 and FIG. 10, this embodiment includes, the TFT array substrate 10, the first light shielding layer 11a which is electrically connected to the capacitance line 3b of the prior stage or the subsequent stage through the contact hole 13. The step between the area where the capacitance line 3b and the first light shielding layer 11a are formed to overlap the data line 6a along the aperture area within the pixel matrix area, and the remaining area is small, compared with the case in which the first light shielding layer 11a is electrically connected to the capacitance line 3b of own stage. If the step along the outline of the aperture area of the pixel matrix area is small, the disclination (orientation defect) of the liquid crystal arising from the step is also small, and the aperture of the pixel matrix area is thus expanded.

The contact hole 13 is drilled to the projecting portion of the first light shielding layer 11a that projects from the main line portion linearly extending as already discussed. It is known that as the contact hole 13 is arranged closer to the edge of the first light shielding layer 11a, stress spreads more from the edge, which may cause a crack. Depending on how close the contact hole 13 is to the edge of the projection portion (preferably, depending on how close the contact hole 13 is to the edge within the margin of the projecting portion), stress acting on the first light shielding layer 11a in the course of the manufacturing process is alleviated. The risk of developing a crack is thus effectively is prevented, and the production yield is heightened.

The capacitance line 3b and the scanning line 3a are constructed of the same polysilicon layer, the dielectric layer of the storage capacitor 70 and the gate insulator 2 are constructed of the same high-temperature oxidized layer, and the first storage capacitor electrode 1f, and the channel region 1a, the source region 1d, and the drain region 1e of the TFT 30 are constructed of the same semiconductor layer 1a. For the foregoing reason, the laminate structure formed on the TFT array substrate 10 is simplified. In the manufacturing method of the liquid-crystal display device, to be discussed later, the capacitance line 3b and the scanning line 3a are produced in the same thin film formation step, and the dielectric layer of the storage capacitor 70 and the gate insulator 2 are concurrently produced.

As shown in FIG. 6, the first light shielding layer 11a extends along the scanning line 3a, and has a plurality of branches respectively extending along the data lines 6a. Compared with the case in which a light shielding layer is integrally arranged in a gridlike configuration, surrounding the aperture area of each pixel, the above arrangement substantially alleviates stress that occurs in the course of heating and cooling in the manufacturing process, because of a difference between the properties of the layers, in the laminate structure of the liquid-crystal display device constructed of the polysilicon layers forming the first light shielding layer 11a, the scanning line 3a, and the capacitance line 3b, the metal layer forming the data line 6a, and interlayer insulators, The generation of cracks in the first light shielding layer 11a is controlled, and the production yield of the device is increased.

The linear main line portion of the first light shielding layer 11a generally overlaps the linear main line portion of the capacitance line 3b as shown in FIG. 6. As long as the first light shielding layer 11a is arranged in a position covering the channel region of the TFT 30 and overlaps at any point the capacitance line 3b so that the contact hole 13 may connect the first light shielding layer 11a to the capacitance line 3b, the function of lightshielding the TFT and the function of providing a low-resistance to the capacitance line are carried out. The first light shielding layer 11a may be extended to cover an elongated spacing between the scanning line 3a and the capacitance line 3b running therealong, and further to partly overlap the scanning line 3a.

The contact hole 13 drilled in the first interlayer insulator 12 assures a secure and reliable electrical connection between the capacitance line 3b and the first light shielding layer 11a. Such a contact hole 13 may be drilled on a per pixel basis, or may be drilled for every group of pixels.

When the contact hole 13 is drilled on a per pixel basis, the first light shielding layer 11a imparts low resistance to the capacitance line 3b, and the redundant structure is assured between the first light shielding layer 11a and the capacitance line 3b. Drilling the contact hole 13 for every group composed of a plurality of pixels (for instance, for every two pixels or for three pixels) is very advantageous, with the benefits from the low resistance and redundant structure of the capacitance line 3b by the use of the first light shielding layer 11a adequately balanced with the complexity of the manufacturing process required to drill a number of contact holes 13, the possibility of failures of the liquid-crystal display device attributed to the contact holes 13 while taking into account the sheet resistance, drive frequency of the capacitance line 3b and the first light shielding layer 11a, and required specifications.

If viewed from the counter substrate 20, the contact holes 13, arranged on a per pixel basis or a per pixel group basis, are drilled below the data line 6a. The contact hole 13 is thus out of the aperture area of the pixel matrix area, and is arranged in the first interlayer insulator 12 in an area where neither TFT 30 nor first storage capacitor electrode 1f is formed. This arrangement prevents the formation of the contact hole 13 from damaging the TFT 30 and other lines while the pixel matrix area is effectively used.

Referring back to FIG. 10, the pixel switching TFT 30 has an LDD (Lightly Doped Drain) structure, and includes the scanning line 3a, the channel region 1a' of the semiconductor layer 1a in which a channel is formed by the electric field from the scanning line 3a, the gate insulating layer 2 for insulating the scanning line 3a from the semiconductor layer 1a, the data line 6a, the lightly doped source region (source LDD region) 1b and the lightly doped drain region (drain LDD region) 1c of the semiconductor layer 1a, and the heavily doped source region 1d and the heavily doped drain region 1e of the semiconductor layer 1a. A corresponding one of the plurality of the pixel electrodes 9a is connected to the heavily doped drain region 1e. As will be discussed later, the source regions 1b and 1d and the drain regions 1c and 1e are doped with an n-type dopant or a p-type dopant having a predetermined concentration, depending on the corresponding channel thereof, p-type or n-type, of the semiconductor layer 1a. An n-channel TFT is advantageous for its high speed, and is frequently used as the pixel switching TFT 30 as a switching element for the pixel. The data line 6a is fabricated of a light shielding film such as of a metal film of Al, or an alloy film of metal-silicide. A second interlayer insulator 4 through which a contact hole 5 connecting to the heavily doped source region 1d and a contact hole 8 connecting to the heavily doped drain region 1e are formed on the scanning line 3a, the gate insulator 2, and the first interlayer insulator 12. The data line 6a is electrically connected to the heavily doped source region 1d through the contact hole 5 to the source region 1b. A third interlayer insulator 7 through which a contact hole 8 connecting to the heavily doped drain region 1e is formed on the data line 6a and the second interlayer insulator 4. The pixel electrode 9a is thus electrically connected to the heavily doped drain region 1e through the contact hole 8 to the heavily doped drain region 1e. The pixel electrode 9a is formed on top of the third interlayer insulator 7. The pixel electrode 9a may be electrically connected to the heavily doped drain region 1e via an Al film, from which the data line 6a is produced, or via the polysilicon film, from which the capacitance line 3b is constructed.

The pixel switching TFT 30 preferably has the above-referenced LDD structure, but may have an offset structure in which no impurity ion implantation is performed on the lightly doped source region 1b and the lightly doped drain region 1c, or may have a self-aligned type TFT in which a high dose impurity ion is implanted with the gate electrode 3a being used as a mask, to form heavily doped source and drain in a self-alignment process.

The gate electrode (scanning line 3a) of the pixel switching TFT 30 is of a single gate structure in which a single gate is interposed between the source and drain regions 1d and 1e, but alternatively, more than one gate electrode may be interposed therebetween. With dual gates or triple gates employed in a TFT, leakage currents in junctions between the channel region and the source region and between the channel region and the drain region are prevented, and thereby a current during off period is reduced. If at least one of the gate electrodes is arranged in an LDD structure or an offset structure, an off current is reduced, resulting in a stable switching element.

When light is incident on the monocrystalline silicon layer forming the channel region 1a', including: the lightly doped source region 1b; and the lightly doped drain region 1c of the semiconductor layer 1a; a photocurrent is generated through a photoelectric conversion process of the silicon, thereby degrading the transistor characteristics of the pixel switching TFT 30. In this embodiment, the data line 6a for covering the scanning line 3a from above is fabricated of a metal film having a light shielding property, such as of Al. Light is effectively prevented from entering at least the channel region 1a', and LDD regions 1b and 1c of the semiconductor layer 1a. Since the first light shielding layer 11a is arranged beneath the pixel switching TFT 30 as already discussed, returning light is effectively prevented from entering at least the channel region 1a', and the LDD regions 1b and 1c of the semiconductor layer 1a.

Since the first light shielding layer 11a is connected to the capacitance line 3b at the preceding stage or the subsequent stage adjacent thereto in this embodiment, the pixels of the top row or the bottom row need the capacitance line 3b for supplying the first light shielding layer 11a with a fixed voltage. The number of the capacitance lines 3b is thus set to be larger than the number of pixels in a vertical direction by one.

(Manufacturing Method of the Electro-optical Device Using the Process of the Embodiment)

Figure 11:
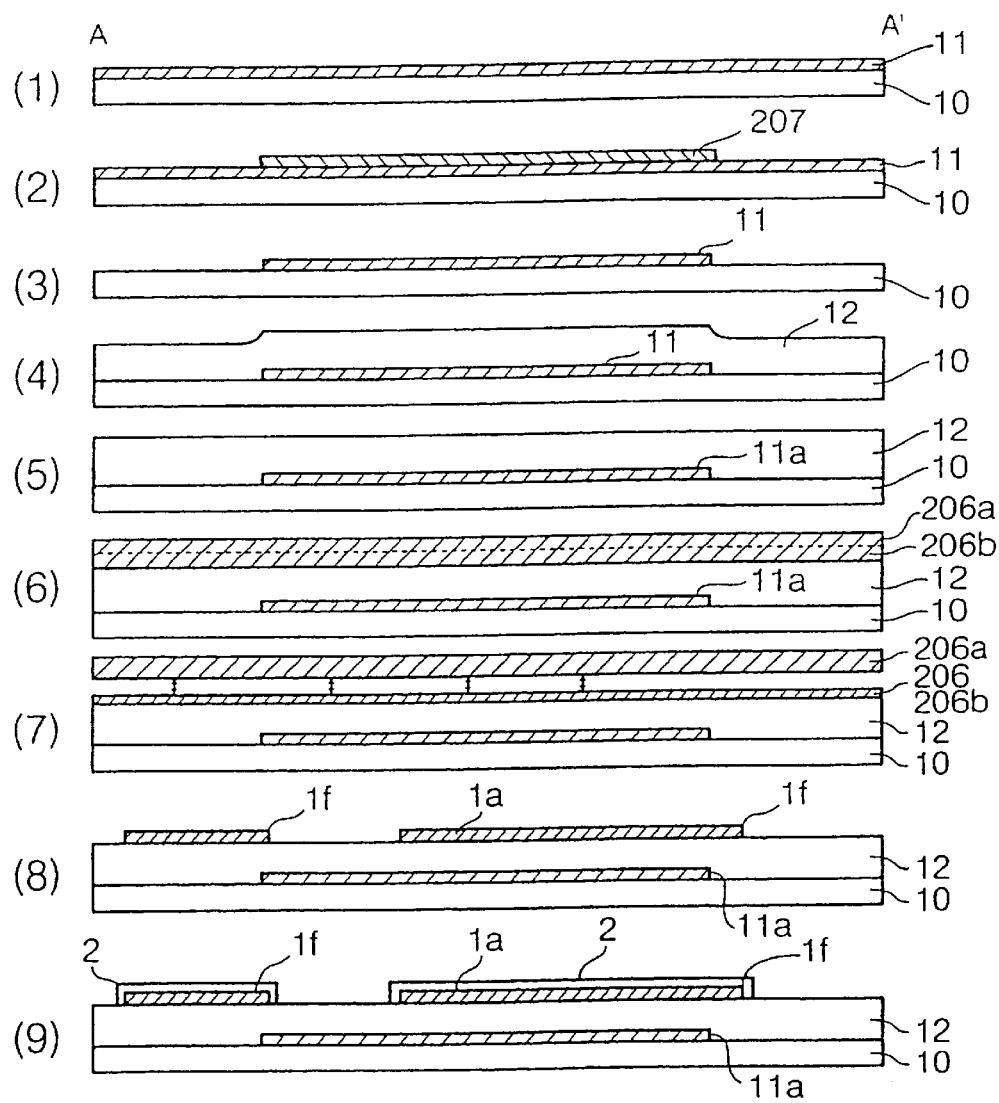
FIG. 11 showing steps (1)–(9) are process diagrams showing a series of manufacturing process steps in accordance with one embodiment of the present invention.
Figure 15:
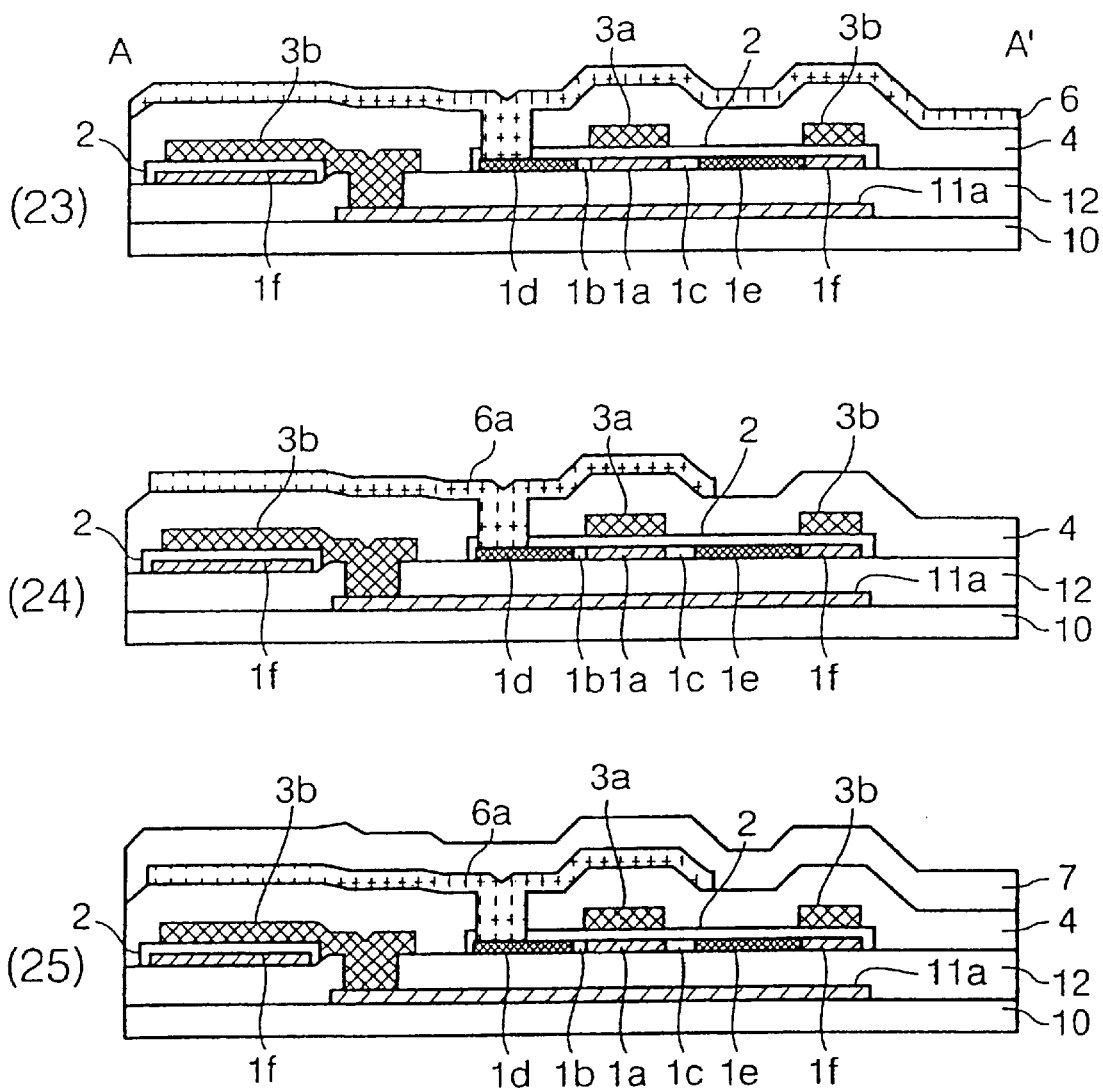
FIG. 15 showing steps (23)–(25) are process diagrams showing a series of manufacturing process steps in accordance with one embodiment of the present invention.

The manufacturing process of the liquid-crystal display device thus constructed is discussed, referring to FIG. 11 step (1) through FIG. 15 step (25)

Figure 16:
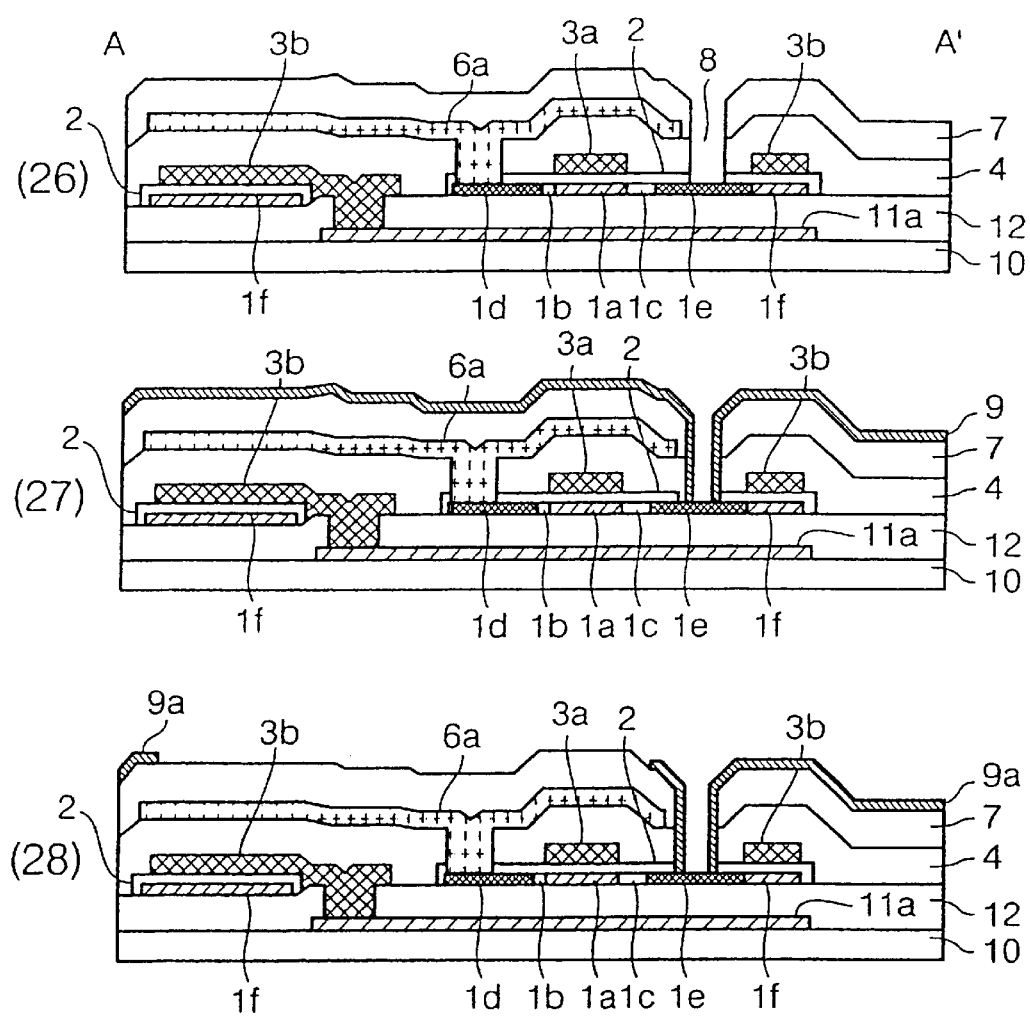
FIG. 16 showing steps (26)–(28) are process diagrams showing a series of manufacturing process steps in accordance with one embodiment of the present invention.

FIG. 11 step (1) through FIG. 16 step (28) show process steps for the TFT array substrate, in the same way as it is shown in FIG. 10 which is the cross-sectional view taken along line x-y' in FIG. 6.

Referring to FIG 11 step (1), the TFT array substrate 10, such as a quartz substrate or a hard glass substrate, is prepared. The TFT array substrate 10 is annealed in an inert gas atmosphere such as $N_2$ (nitrogen) gas within a temperature range of 850 to 1300° C., preferably at a temperature of 1000° C. so that the TFT array substrate 10 suffers less distortion in a subsequent high-temperature thermal process. In other words, the TFT array substrate 10 is beforehand subjected to a heat treatment as high as or higher than the maximum temperature expected in the high-temperature thermal process in the manufacturing process.

Through the sputtering technique, a metal layer of Ti, Cr, W, Ta, Mo or Pd, or an alloy layer of metal silicide is deposited on the entire surface of the TFT array substrate 10 thus processed, and the light shielding layer 11 is thus formed to a thickness within a range of 100 to 500 nm, preferably to a thickness of approximately 200 nm.

Referring to a step shown in FIG. 11 step (2), a resist mask 207 for the pattern of the first light shielding layer 11a (see FIG. 6) is formed through the photolithographic technique. The pattern of the first light shielding layer 11a is formed not only in the transistor-element formation region of the pixel matrix area, but also in the peripheral areas surrounding the pixel matrix area such as the sealing area and the terminal-pad area, as shown in FIG. 7 through FIG. 9.

Referring to a step shown in FIG. 11 step (3), the pattern of the first light shielding layer 11a, shown in FIG. 6, FIG. 7 through FIG. 9, is formed by etching the light shielding layer 11 through the resist mask 207.

Referring to a step shown in FIG. 11 step (4), formed on the first light shielding layer 11a is the first interlayer insulator 12 fabricated of a silicate glass film such as NSG, PSG, BSG, or BPSG, a silicon nitride film, or a silicon oxide film, using TEOS (tetraethylorthosilicate) gas, TEB (triethyl borate) gas, or TMOP (trimethyl phosphate) gas through an atmospheric CVD method or a reduced pressure CVD method. The thickness of the first interlayer insulator 12 is within a range from 400 to 1000 nm, and preferably is approximately 800 nm.

Since the first light shielding layer 11a extends not only in the transistor-element formation region but also in the no-transistor-element region, such as the sealing area and the terminal-pad area in this embodiment, the protruded state of the entire surface of the substrate having the first interlayer insulator 12 formed thereon (i.e., the surface of the first interlayer insulator 12) is substantially equalized.

Referring to a step shown in FIG. 11 step (5), the surface of the first interlayer insulator 12 is globally polished for planarization. For instance, the CMP (chemical mechanical polish) process may be employed as a means for planarization through polishing. Since the first interlayer insulator 12 has an equalized protruded state on the entire surface thereof, the polishing rate is also equalized over the entire surface, and a surface having a good flatness thus results.

Referring to a step shown in FIG. 11 step (6), the monocrystalline silicon substrate 206a is bonded to the substrate 10, The monocrystalline silicon substrate 206a to be bonded has a thickness of 600 mm. The monocrystalline silicon substrate 206a is beforehand oxidized to a depth of 0.05 to 0.8 mm on the surface thereof to form the oxide layer 206b, and is implanted with a dose of $10e16/cm^2$ of hydrogen ions ($H^+$) at an acceleration voltage of 100 KeV. The bonding process uses a method of directly bonding the two substrates in a thermal process for two hours at a temperature of 300° C.

Referring to a step shown in FIG. 11 step (7), a thermal process is performed to peel the monocrystalline silicon substrate 206a off the substrate 10 with the oxide layer 206b, at the bonding side of the monocrystalline silicon substrate 206a, and the monocrystalline silicon layer 206 left. The peel process takes place because the hydrogen ions introduced into the monocrystalline silicon layer break the bond of silicon at a layer close to the surface of the monocrystalline silicon layer. The peel process is performed by subjecting the two bonded substrates to a thermal process to a temperature of 600° C. of a ramp rate of 20° C./m. Through this thermal process, the monocrystalline silicon substrate 206a is peeled off the substrate 10, and a monocrystalline silicon layer 206 having a thickness of 200 nm±5 nm remains on the substrate 10. The thickness of the monocrystalline silicon layer 206 bonded to the substrate 10 is varied within a range from 50 nm to 300 nm by changing the acceleration voltage for the hydrogen ion implantation to the above-referenced monocrystalline silicon substrate 206a.

Referring to FIG. 11 step (8), the semiconductor layer 1a having the pattern shown in FIG. 6 is formed through photolithographic process, etching process, etc. The first storage capacitor electrode 1f, which extends from the semiconductor layer 1a of the pixel switching TFT 30, is formed in an area where the capacitance line 3b is formed beneath the data line 6a and in an area where the capacitance line 3b is formed along the scanning line 3a.

Referring to FIG. 11 step (9), the first storage capacitor electrode 1f along with the semiconductor layer 1a forming the pixel switching TFT 30 is thermally oxidized for 72 minutes at a temperature within a range from 850 to 1300° C., preferably at a temperature of approximately 1000° C., and a thermally oxidized silicon layer as thin as approximately 60 nm is produced. The gate insulator 2 for capacitance is thus formed along with the gate insulator 2 of the pixel switching TFT 30. The thickness of the semiconductor layer 1a and the first storage capacitor electrode 1f falls within a range of 30 to 170 nm, and the thickness of the gate insulating layer 2 is approximately 60 nm.

Figure 12:
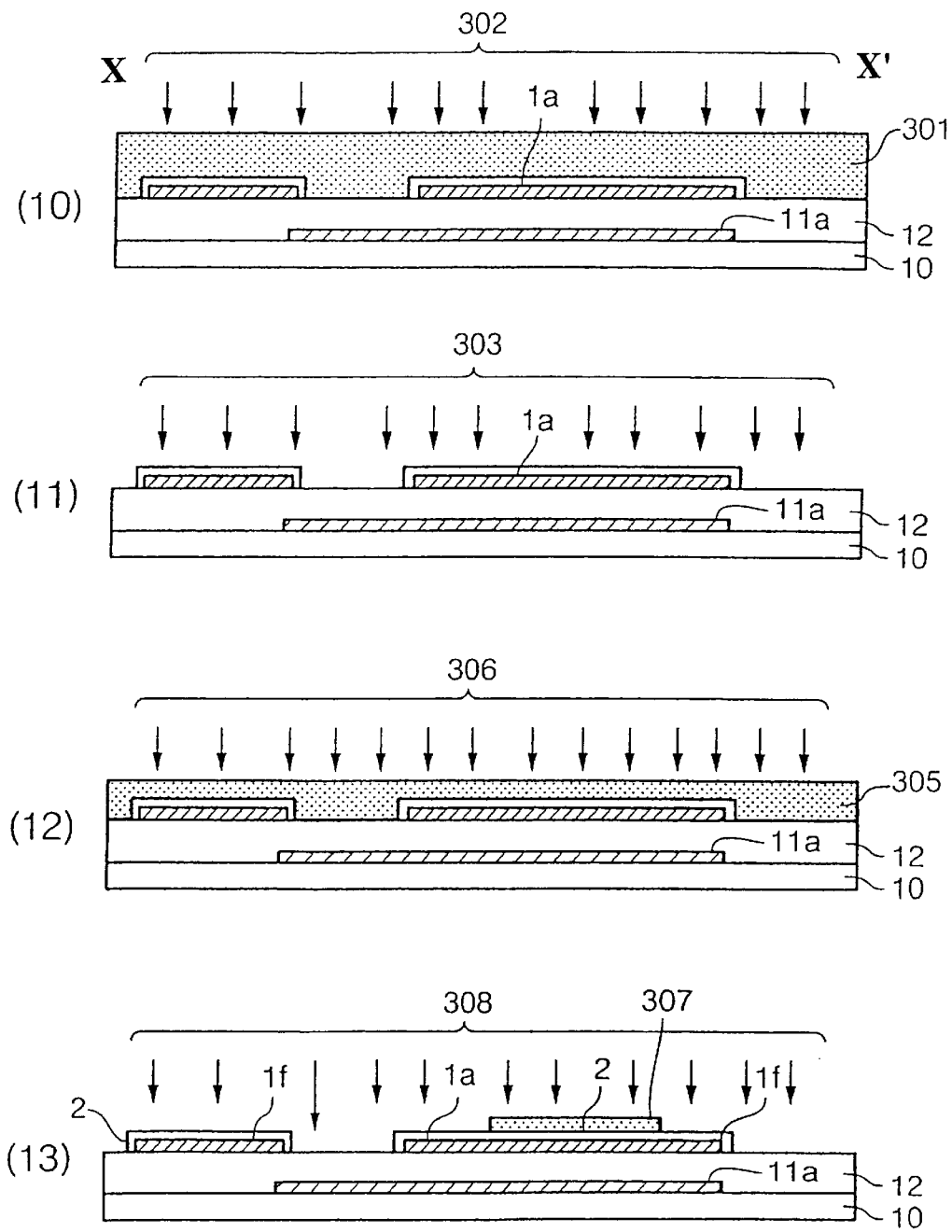
FIG. 12 showing steps (10)–(13) are process diagrams showing a series of manufacturing process steps in accordance with one embodiment of the present invention.

Referring to FIG. 12 step (10), a resist film 301 is formed in an area corresponding to the N-channel semiconductor layer 1a, while the P-channel semiconductor layer 1a is lightly doped with a group V dopant 302 such as P (for instance, at a dose of $2e\ 11/cm^2$ of P ions at an acceleration voltage of 70 keV).

Referring to FIG. 12 step (11), a resist film is formed in an area corresponding to the P-channel semiconductor layer 1a (not shown), while the N-channel semiconductor layer 1a is doped with a group III dopant 303 such as B (for instance, at a dose of $1e\ 12/cm^2$ of B ions at an acceleration voltage of 35 keV).

Referring to FIG. 12 step (12), a resist film 305 is formed on the surface of the substrate 10, other than an end portion of the channel region 1a' of the semiconductor layer 1a of each of the P-channel and N-channel. At an end portion 304, the P-channel is doped with a group V dopant 306 such as P, at a dose one to ten times stronger than the dose used in the step shown in FIG. 12 step (10), and the N-channel is doped with a group III dopant 306 such as B at a dose one to ten times stronger than the dose used in the step shown in FIG. 12 step (11).

Referring to a step shown in FIG. 12 step (13), to impart low resistance to the first storage capacitor electrode 1f that is formed by extending the semiconductor layer 1a, a resist film 307 (wider than the scanning line 3a) is formed in an area corresponding to the scanning line 3a (gate electrode) on the surface of the substrate 10, and the substrate 10 is then lightly doped with a group V dopant 308 such as P with the resist film 307 used as a mask (for instance, at a dose of $3e\ 14/cm^2$ of P ions at an acceleration voltage of 70 keV).

Figure 13:
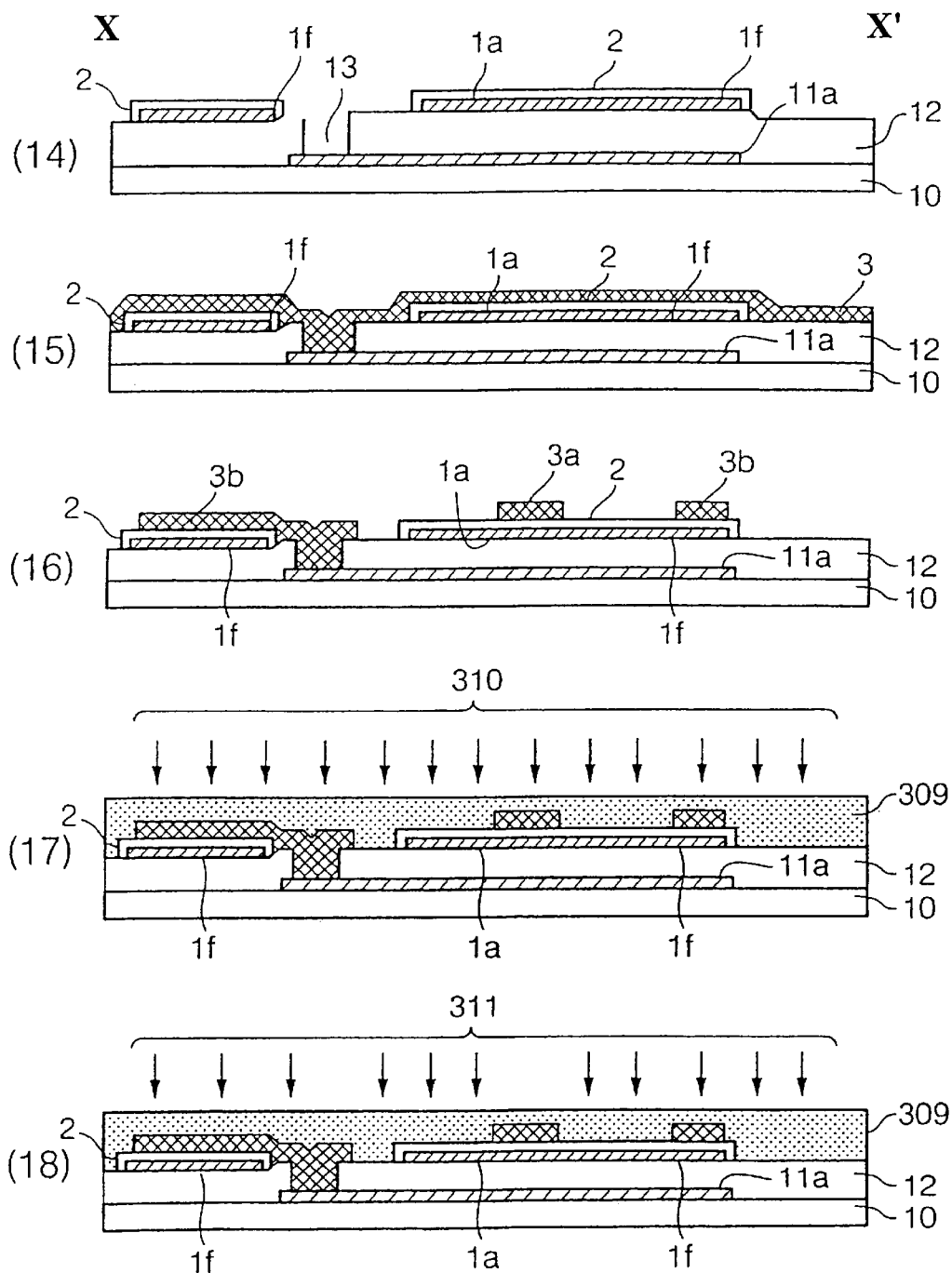
FIG. 13 showing steps (14)–(18) are process diagrams showing a series of manufacturing process steps in accordance with one embodiment of the present invention.

Referring to a step shown in FIG. 13 step (14), the contact hole 13 leading to the first light shielding layer 11a is drilled in the first interlayer insulator 12 through a dry etching process such as a reactive etching or a reactive ion beam etching, or a wet etching process. In this case, the contact hole 13 is preferably formed through anisotropic etching such as reactive etching or reactive ion beam etching, because the hole can be drilled in a shape approximately identical to that of the mask. With the dry etching and the wet etching used in combination, the contact hole 13 is tapered, and an open circuit is thus prevented during a wiring process.

Referring to a step shown in FIG. 13 step (15), the polysilicon layer 3 is deposited to a thickness of 350 nm through the reduced pressure CVD method, and thermally diffused with phosphorus (P). The polysilicon layer 3 thus becomes electrically conductive. It is also acceptable to use a doped polysilicon layer which is doped with P ions during formation of the polysilicon layer 3. In this way, the electrical conductivity of the polysilicon layer 3 is enhanced.

Referring to a step shown in FIG. 13 step (16), the capacitance line 3b is formed along with the scanning line 3a having the pattern shown in FIG. 6 through photolithographic process, etching process, etc., using a resist mask. Polysilicon left on the back side of the substrate 10 is removed through etching with the front side of the substrate 10 covered with a resist film.

Referring to a step shown in FIG. 13 step (17), an area corresponding to the N-channel semiconductor layer 1a is covered with a resist film 309 (the N-channel semiconductor layer 1a is shown in FIG. 13 step (17)) to form a P-channel LDD region in the semiconductor layer 1a, and is lightly doped with a group III dopant 310 such as B with the scanning line (gate electrode) 3a used as a diffusion mask (for instance, at a dose of $3e13/cm^2$ of BF2 ions at an acceleration voltage 90 keV). The P-channel lightly doped source region 1b and lightly doped drain region 1c are thus formed.

Referring to a step shown in FIG. 13 step (18), the P-channel heavily doped source region 1d and P-channel heavily doped drain region 1e are formed in the semiconductor layer 1a. With the area corresponding to the N-channel semiconductor layer 1a covered with the resist film 309 and with a resist film (not shown) as a mask wider in width than the scanning line 3a formed on the scanning line 3a corresponding to the P-channel, the substrate 10 is heavily doped with a group III dopant 311 such as B (for instance, at a dose of $2e15/cm^2$ of BF2 ions at an acceleration voltage of 90 keV).

Figure 14:
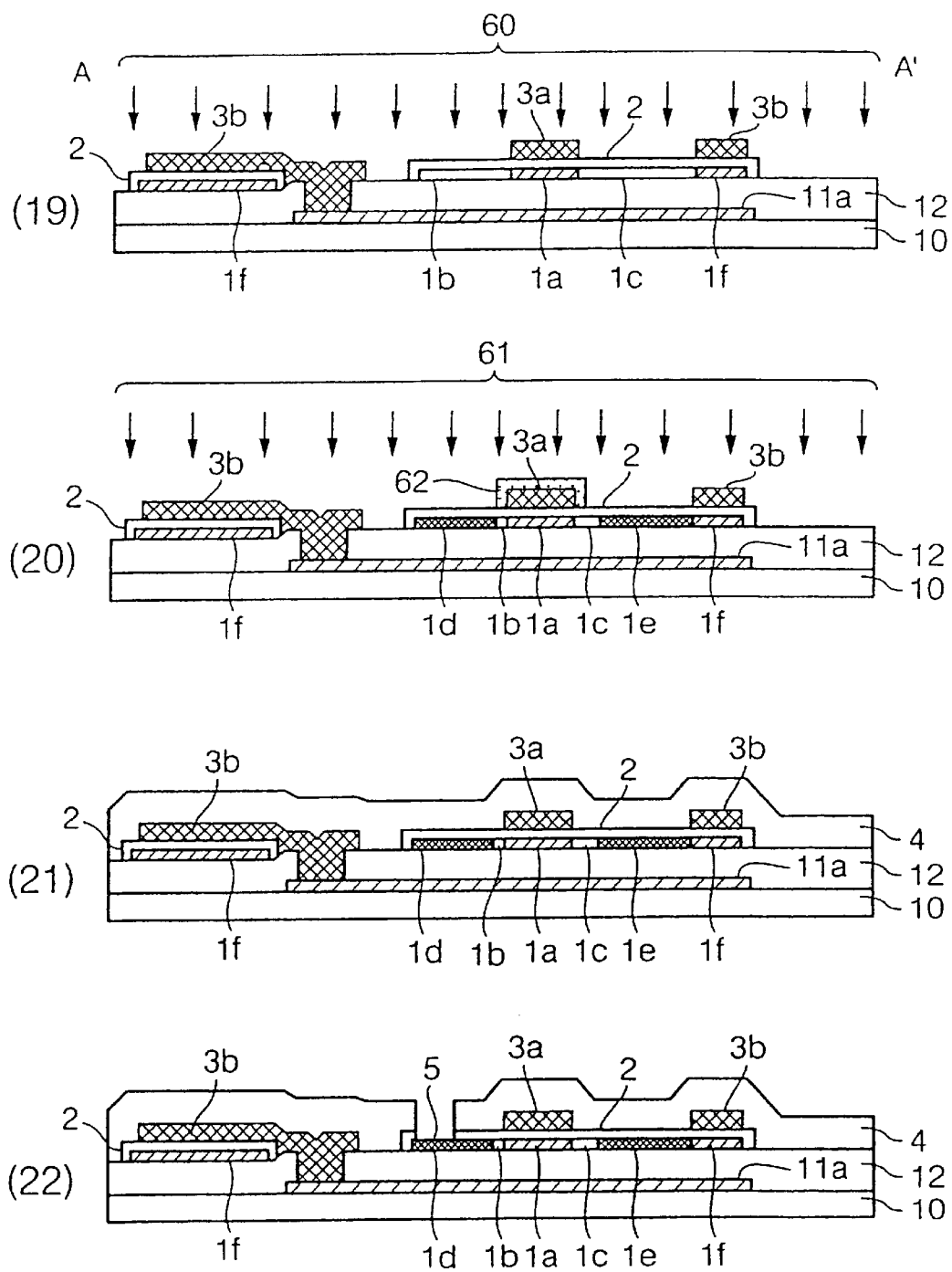
FIG. 14 showing steps (19)–(22) are process diagrams showing a series of manufacturing process steps in accordance with one embodiment of the present invention.

Referring to a step shown in FIG. 14 step (19), the N-channel LDD regions are formed in the semiconductor layer 1a. The substrate 10 is lightly doped with a group V dopant 60 such as P with an area corresponding to the P-channel semiconductor layer 1a covered with a resist film (not shown) and with the scanning line 3a (gate electrode) used as a diffusion mask (for instance, at a dose of $6e12/cm^2$ of P ions at an acceleration voltage of 70 keV). The N-channel lightly doped source region 1b and lightly doped drain region 1c are thus formed.

Referring to a step shown in FIG. 14 step (20), the N-channel heavily doped source region 1d and heavily doped drain region 1e are formed in the semiconductor layer 1a. After a resist film 62 having a width wider than that of the scanning line 3a is formed on the scanning line 3a in an area corresponding to the N-channel, the substrate 10 is heavily doped with a group V dopant 61 such as P (for instance, at a dose of $4e15/cm^2$ of P ions at an acceleration voltage 70 keV).

Referring to a step shown in FIG. 14 step (21), the second interlayer insulator 4, fabricated of a silicate glass film such as NSG, PSG, BSG, or BPSG, a silicon nitride film, or a silicon oxide film, is formed using TEOS gas, TEB (triethyl borate) gas, or TMOP (trimethyl phosphate) gas or the like through an atmospheric CVD method or a reduced pressure CVD method. The second interlayer insulator 4 thus covers the scanning line 3a in the pixel switching TFT 30 together with the capacitance line 3b and the scanning line 3a. The thickness of the second interlayer insulator 4 is within a range from 500 to 1500 nm, and preferably is approximately 800 nm.

An annealing process is performed at about 85° C. for 20 minutes to activate the heavily doped source region 1d and the heavily doped drain region 1e.

Referring to a step shown in FIG. 14 step (22), the contact hole 5 leading to the data line 6a is formed in the second interlayer insulator 4 through a dry etching process such as a reactive etching or a reactive ion beam etching, or a wet etching process. In this case, contact holes for connecting the scanning line 3a and the capacitance line 3b to lines (unshown) are drilled in the second interlayer insulator 4 in the same step for that for the contact hole 5.

Referring to a step shown in FIG. 15 step (23), a metal layer 6, fabricated of a low-resistance metal having light shielding property such as Al, or metal silicide, is formed on the second interlayer insulator 4 to a thickness within a range from 100 to 700 nm, preferably to a thickness of about 350 nm, through a sputtering process. Referring to a step shown in FIG. 15 step (24), the data line 6a is formed through the photolithographic process, the etching process, etc.

Referring to a step shown in FIG. 15 step (25), using TEOS gas through an atmospheric CVD method or a reduced pressure CVD method, the third interlayer insulator 7, fabricated of a silicate glass film such as NSG, PSG, BSG, or BPSG, a silicon nitride film, or a silicon oxide film, is formed to cover the data line 6a. The thickness of the third interlayer insulator 7 is within a range from 500 to 1500 nm, and preferably is approximately 800 nm.

Referring to a step shown in FIG. 16 step (26), the contact hole 8 for electrically connecting the pixel electrode 9a to the heavily doped drain region 1e in the pixel switching TFT 30 is formed through a dry etching process such as a reactive etching or a reactive ion beam etching.

Referring to a step shown in FIG. 16 step (27), the transparent, electrically conductive layer 9 such as an ITO layer is formed on the third interlayer insulator 7 to a thickness within a range of 50 to 200 nm through sputtering process. Referring to a step shown in FIG. 16 step (28) the pixel electrode 9a is formed through the photolithographic process, the etching process, etc. When the liquid-crystal display device is of a reflective type, the pixel electrode 9a may be fabricated of an opaque material having a high reflectivity.

After a polyimide-based coating liquid for an alignment layer is applied onto the pixel electrode 9a, a rubbing process is performed in a predetermined direction at a predetermined pretilt angle. The alignment layer 16 thus results (see FIG. 10).

For the counter substrate 20 shown in FIG. 10, a glass substrate is prepared. The second light shielding layer 23 and a second light shielding layer as a peripheral parting bead, to be discussed later, are formed by sputtering of chromium, and then by photolithographic process, etching process, etc. The second light shielding layer may be fabricated of a metal such as Cr, Ni, Al, or may be resin black in which carbon or Ti is dispersed in a photoresist.

A transparent, electrically conductive layer, such as an ITO layer is deposited on the entire surface of the counter substrate 20 to a thickness within a range of 50 to 200 nm. The counter electrode 21 thus results. After a polyimide-based coating liquid forming an alignment layer is applied on the entire surface of the counter electrode 21, the alignment layer is subjected to a rubbing process for a predetermined pretilt angle. The alignment layer 22 thus results (see FIG. 10).

The TFT array substrate 10 and the counter substrate 20, each having its own layers formed thereon, are attached to each other using a sealing material 52 with the alignment layer 16 facing the alignment layer 22. Through vacuum absorption, a mixture of a plurality of nematic liquid crystals is drawn into the gap between the two substrates. The liquid-crystal layer 50 having a predetermined thickness is thus obtained.

(General Construction of the Liquid-crystal Display Device)

Figure 18:
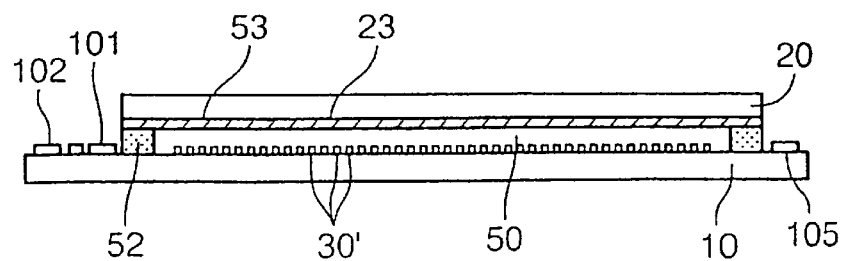
FIG. 18 is a cross-sectional view of the liquid-crystal display device taken along line XVIII-XVIII' in FIG. 17.

The general construction of the liquid-crystal display device of the above embodiments is now discussed, referring to FIG. 17 and FIG. 18. FIG. 17 is a plan view of the TFT array substrate 10 with components arranged thereon, viewed from the counter substrate 20, and FIG. 18 is a cross-sectional view of the liquid-crystal display device including the counter substrate 20, taken along line H-H' in FIG. 17.

Referring to FIG. 17, the TFT array substrate 10 is provided with a sealing material 52 along the edge thereof, and a second light shielding layer 53 as a peripheral parting bead, fabricated of the same material as that of the light shielding layer 23, or fabricated of a different material, and the second light shield layers 53 extend along the internal edge of the sealing material 52. A data-line drive circuit 101, and external-circuit interconnect terminals 102 are arranged on one side of the TFT array substrate 10, external to the area of the sealing material 52, and scanning-line drive circuits 104 are arranged on two sides of the first side of the TFT array substrate 10. If a delay in the scanning signal supplied to the scanning line 3a presents no problem, the scanning-line drive circuit 104 may be mounted on one side only. Data-line drive circuits 101 may be arranged on both sides of the image display area. For instance, odd data lines 6a may be supplied with the image signal by the data-line drive circuit arranged on one side of the image display area, and even data lines 6a may be supplied with the image signal by the data-line drive circuit arranged on the opposite side of the image display area. If the data lines 6a are driven in an interdigital fashion in this way, the area occupied by the data-line drive circuits 101 is expanded, and a complex circuit may be incorporated therewithin. A plurality of lines 105 for connecting the scanning-line drive circuits 104 mounted on both sides of the image display area are arranged on the remaining one side of the image display area of the TFT array substrate 10. A precharge circuit may be arranged beneath the second light shielding layer 53 as the peripheral parting bead. A conductive material 106 for electrically connecting the TFT array substrate 10 to the counter substrate 20 is mounted at least one corner of the counter substrate 20. Referring to FIG. 18, the counter substrate 20 having almost the same outline as that of the sealing material 52 shown in FIG. 17 is bonded to the TFT array substrate 10 through the sealing material 52.

A test circuit for checking the quality and defects of the electro-optical device in the middle of the production or at the shipment thereof may be arranged on the TFT array substrate 10. The data-line drive circuit 101 and the scanning-line drive circuit 104 may be electrically and mechanically connected to a driver LSI mounted on a TAB (Tape Automated Bonding board), through an anisotropically electrically conductive film arranged about the TFT array substrate 10, rather than mounting the data-line drive circuit 101 and the scanning-line drive circuit 104 on the TFT array substrate 10. Arranged on the light incident side of the counter substrate 20 and the light exit side of the TFT array substrate 10 are respectively polarizing films, retardation films, and polarizing means in predetermined directions to work with operation modes such as a TN (twisted nematic) mode, an STN (super TN) mode, or a D-STN (dual-scan STN) mode, and normally white mode/normally black mode.

When the liquid-crystal display of each of the above embodiments is incorporated in a color liquid-crystal projector (a projection-type display device), three panels of the electro-optical devices are used as RGB light valves, and each light valve receives the respective color light separated through RGB color separating dichroic mirrors. In each of the above embodiments, the counter substrate 20 is equipped with no color filter. Optionally, an RGB color filter may be arranged in a predetermined area facing the pixel electrode 9a having no light shielding layer 23, on the counter substrate 20 along with a protective file. In this way, the liquid-crystal display device of each embodiment finds applications in a direct viewing or reflective type color liquid-crystal television, besides the liquid-crystal projector. Microlenses may be arranged on the counter substrate 20 on a one microlens to one pixel basis. In this way, condensation efficiency of the incident light is increased, and a liquid-crystal display device providing a bright image results. By laminating interference layers having different refractive indexes on the counter substrate 20, a dichroic filter for creating the RGB colors is formed taking advantage of interference of light. The counter substrate with such a dichroic filter equipped makes an even brighter liquid-crystal display device.

In the liquid-crystal display device of each of the above-referenced embodiments, light is incident on the counter substrate 20 as in the conventional art. Since the TFT array substrate 10 is equipped with the first light shielding layer 11a, incident light may be introduced to the TFT array substrate 10 with the counter substrate 20 emitting exit light. The liquid-crystal display device, incorporated in a liquid-crystal projector, prevents light from entering the channel region 1a' and the LDD regions 1b and 1c, thereby presenting a high-quality image. Conventionally, polarizing means having an AR (anti-reflection) coating thereon or an AR film needs to be bonded to the back of the TFT array substrate 10 to prevent reflection on the back. In the above embodiments, however, the first light shielding layer 11a is arranged between the surface of the TFT array substrate 10 and at least the channel region 1a' of the semiconductor layer 1a, and the LDD regions 1b and 1c. There is no need for the polarizing means with the AR coating, or AR film, or a AR-processed TFT array substrate 10. Since no polarizing means is used in the above embodiments, material costs are reduced, and the device is free from dirt and scratches, which might be introduced if the polarizing means were introduced, and the production yield is maintained. Since the device of the above embodiments offers a high light fastness, image defects such as cross talk will not occur even when a bright light source is used or even when light utilization is increased through polarization by a polarizing beam splitter.

(Electronic Equipment)

Figure 19:
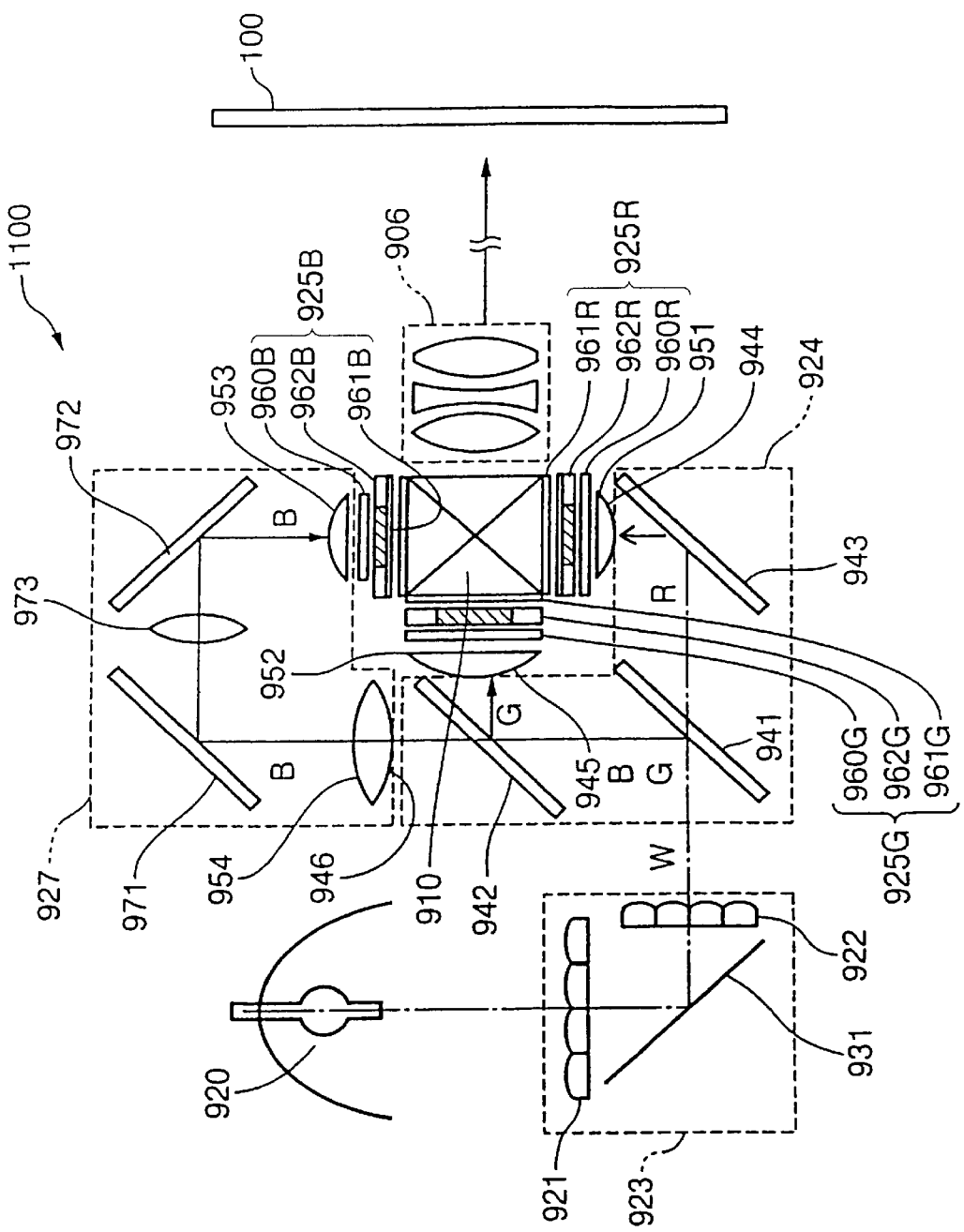
FIG. 19 is a diagram showing a projection-type display apparatus as one example of electronic equipment incorporating the liquid-crystal display device.

A projection-type display apparatus, as an example of the electronic equipment incorporating the liquid-crystal display device of the above embodiments, is now discussed, referring to FIG. 19. FIG. 19 is a diagrammatic view generally showing an optical system of the projection-type display apparatus 1100 which includes the three of the above-referenced liquid-crystal display devices 962R, 962G, and 962B for the RGB colors. The optical system of the projection-type display apparatus includes a light source device 920 and a uniform illumination optical system 923. The projection-type display apparatus includes a color separating optical system 924 as color separating means for separating the luminous flux W from the uniform illumination system 923 into red (R), green (G) and blue (B) luminous fluxes, three light valves 925R, 925G, and 925B as modulating means for modulating the three luminous fluxes R, G, and B, a color synthesizing prism 910 as color synthesizing means for synthesizing the modulated color luminous fluxes, and a projection lens unit 906 as projection means for enlarging and projecting the synthesized luminous fluxes on the surface of a projection screen 100. Also arranged is a light guide system 927 that guides the blue luminous flux B to the light valve 925B.

An uniform illumination optical system 923 includes two lens assemblies 921 and 922, and a reflective mirror 931. The reflective mirror 931 subtends a right angle the two lens assemblies 921 and 922 make. Each of the two lens assemblies 921 and 922 of the uniform illumination optical system 923 includes a matrix of rectangular lenses. The luminous flux emitted from the light source 920 is divided into a plurality of partial luminous fluxes through the rectangular lenses of the first lens assembly 921. The partial luminous fluxes are superimposed in the vicinities of the three light valves 925R, 925G, and 925B through the second lens assembly 922. The three light valves 925R, 925G, and 925B are uniformly illuminated even when the light source 920 gives a nonuniform output luminous flux in the cross section thereof with the uniform illumination optical system 923.

The color separating optical system 924 includes a blue/green-reflecting dichroic mirror 941, a green-reflecting dichroic mirror 942, and a reflective mirror 943. The blue luminous flux B and the green luminous flux G contained in the luminous flux W are first reflected at a right angle off the blue/green-reflecting dichroic mirror 941 toward the green-reflecting mirror 942. The red luminous flux R passes through the blue/green-reflecting dichroic mirror 941, is reflected at a right angle off the reflective mirror 943, and reaches the prism unit 910 via the exit section 944 for the red luminous flux R.

The green luminous flux G only out of the blue and green luminous fluxes B and G reflected off the mirror 941 is reflected at a right angle off the green-reflecting mirror 942, and is delivered out toward the color synthesis system via the exit section 495 for the green luminous flux G. The blue luminous flux B passing through the mirror 942 is delivered toward the light guide system 927 via the exit section 946 for the blue luminous flux B. In this embodiment, the distances from the exit section of the luminous flux W of the illumination optical system respectively to the exit sections 944, 945, and 946 in the color separating optical system 924 are set to be substantially equal.

Condenser lenses 951 and 952 are respectively arranged on the exit sides of the exit sections 944 and 945 for the red R and green G colors in the color separating optical system 924. These color luminous fluxes from the respective exit sections are therefore collimated through the condenser lenses 951 and 952.

The red and green luminous fluxes R, G, collimated in this way, are respectively introduced to the liquid-crystal light valves 925R and 925G to be modulated there. Image information for each color is thus imparted to the respective luminous fluxes. Specifically, the liquid-crystal display devices are controlled in response to image information by unshown drive means, and each color light passing therethrough is thus modulated. The blue luminous flux B, is guided to the liquid-crystal light valve 925B via the light guide system 927 and is similarly modulated in response to the image information. The liquid-crystal light valves 925R, 925G and 925B are respectively composed of light entrance polarizing means 960R, 960G, and 960B, light exit polarizing means 961R, 961G, and 961B, and liquid-crystal display devices 962R, 962G, and 962B.

The light guide system 927 includes a condenser lens 954 arranged on the exit side of the exit section 946 for the blue luminous flux B, an entrance reflective mirror 971, an exit reflective mirror 972, an intermediate lens 973 disposed between these mirrors, and a condenser lens 953 disposed in front of the liquid-crystal display device 925B. The blue luminous flux B emitted from the condenser lens 946 is introduced into the liquid crystal display device 962B via the light guide system 927. Among the lengths of the optical paths of the color luminous fluxes from the light exit section for the luminous flux W to the respective liquid-crystal display devices 962R, 962G, and 962B, the length of the optical path of the blue luminous flux B is the longest, and thus the blue luminous flux suffers a maximum loss. By arranging the light guide system 927, however, the light loss the blue luminous flux is controlled.

The color luminous fluxes R, G and B modulated through the respective liquid-crystal light valves 925R, 925G, and 925B are introduced into the prism unit 910 to be synthesized there. A color image synthesized by the prism unit 910 is enlarged and projected through a projection lens unit 906 to a screen 100 at a predetermined position.

Since the light shielding layers are arranged beneath the TFTs in the liquid-crystal display devices 962R, 962G, and 962B, the channels of the pixel electrode switching TFTs are sufficiently light-shielded even if the TFT array substrate is subject to incident light such as returning light. The returning light may be reflected light from the projection optical system in the liquid crystal projector based on projection light from the liquid-crystal display devices 962R, 962G, and 962B, light reflected from the surface of the TFT array substrate when the projection light passes therethrough, or part of the projection light that has passed through the projection optical system after passing through another liquid-crystal display device.

In a projection optical system having a prism unit appropriate for compact design, there is no need for a returning light prevention film between each of the liquid-crystal display devices 962R, 962G, and 962B and the prism unit, or no need for returning light prevention process on the polarizing means. The construction of the device is thus advantageously miniaturized and simplified.

Since the above embodiments control the effect of the returning light on the TFT channel regions, the device does not require the polarizing means 961R, 961G, and 961B with the returning light prevention processed. Referring to FIG. 19, the polarizing means may be arranged separately from the liquid-crystal display device. Specifically, the polarizing means 961R, 961G, and 961B are glued onto the prism unit 910, and the polarizing means 960R, 960G, and 960B are glued onto the condenser lenses 953, 945, and 944. With the polarizing means glued onto the prism unit or the condenser lenses, heat of the polarizing means sinks in the prism unit or the condenser lenses, and a rise in the temperature of the liquid-crystal display device is thus prevented.

Since the liquid-crystal display device and the polarizing means are separately formed, an air layer, though not shown, between the liquid-crystal display device and the polarizing means. Cooling means is arranged to send cooling air between the liquid-crystal display device and the polarizing means, and a rise in the temperature of the liquid-crystal display device is controlled even further. Erratic operation due to the temperature rise of the liquid-crystal display device is thus prevented.

What is claimed is:

1. A method for manufacturing an electro-optical device, comprising:

forming a light shielding layer above one side of a light transmissive substrate;

patterning the light shielding layer;

forming an insulating layer above the patterned light shielding layer;

planarizing the insulating layer;

bonding a monocrystalline silicon layer on the surface of the planarized insulating layer; and forming a transistor element from the monocrystalline silicon layer, the patterned light shielding layer being arranged in an area facing the transistor element and in a peripheral area of the transistor element.

2. The method for manufacturing an electro-optical device according to claim 1, the light transmissive substrate being bonded to a counter substrate through a sealing member, and the peripheral area being an area facing the sealing member.

3. The method for manufacturing an electro-optical device according to claim 1, the step of planarizing the insulating layer formed on the light transmissive substrate using a chemical mechanical polishing process.

4. An electro-optical device, comprising:
   a patterned light shielding layer formed above one side of a light transmissive substrate,
   a planarized insulating layer formed above the patterned light shielding layer; and
   a switching element formed above the planarized insulating layer, the patterned light shielding layer being arranged in an area facing the transistor element and in a peripheral area of the transistor element.

5. The electro-optical device according to claim 4, the light shielding layer in an area having no transistor element therewithin extending in a pattern that is developed by two-dimensionally repeating a pattern formed in an area where the transistor element is arranged.

6. The electro-optical device according to claim 4, the light transmissive substrate being fabricated of quartz, and the light shielding layer being fabricated of a refractory metal or a refractory metal-silicide.

7. A method for manufacturing an electro-optical device comprising a display area which includes a transparent substrate, a matrix of pixel electrodes and transistors connected to the respective pixel electrodes, and an external-circuit interconnect terminal for receiving a signal from a drive circuit; and an external circuit arranged in a peripheral area surrounding the display area, the method comprising:
   forming a light shielding layer above the transparent substrate;
   patterning the light shielding layer;
   forming an insulating layer above the patterned light shielding layer;
   planarizing the insulating layer;
   bonding a monocrystalline silicon layer above the surface of the planarized insulating layer; and
   forming the transistor from the monocrystalline silicon layer, the patterned light shielding layer being arranged in an area of the transistor and in the peripheral area thereto; and
   the light shielding layer in the peripheral area being arranged to face the drive circuit.

8. The method for manufacturing an electro-optical device according to claim 7, the patterned light shielding layer being arranged in an area facing the external-circuit interconnect terminal.

9. A method for manufacturing an electro-optical device comprising a display area which includes a transparent substrate, a matrix of pixel electrodes and transistors connected to the respective pixel electrodes provided on the substrate and an external-circuit interconnect terminal for receiving a signal from a drive circuit; and an external-circuit arranged in a peripheral area of the display area, the method comprising:
   forming a light shielding layer above the transparent substrate;
   patterning the light shielding layer;
   forming an insulating layer above the patterned light shielding layer;
   planarizing the insulating layer;
   bonding a monocrystalline silicon layer above the surface of the planarized insulating layer; and
   forming the transistor from the monocrystalline silicon layer, the patterned light shielding layer being arranged in an area of the transistor and in the peripheral area thereto, and
   the light shielding layer in the peripheral area being arranged in the vicinity of the drive circuit and the external-circuit interconnect terminal but not arranged in an area facing the drive circuit.

10. The method for manufacturing an electro-optical device according to claim 7, the step of planarizing the insulating layer using a chemical mechanical polishing process.

11. The method for manufacturing an electro-optical device according to claim 7, the light shielding layer arranged in an area facing the transistor and the light shielding layer arranged in the periphery of the display area having generally identical shapes.

12. The electro-optical device according to claim 4, the light transmissive substrate being a first light transmissive substrate the electro-optical device further comprising:
   a second light transmissive substrate arranged to be opposed to the surface of the first light transmissive substrate having the monocrystalline silicon layer thereon; and
   a liquid crystal interposed between the first and second light transmissive substrates, and driven by a switching element formed in the area of the transistor element.

13. An electronic equipment, comprising:
   a light source;
   the electro-optical device according to claim 12, that modulates a light beam entering thereon from the light source in response to image information; and
   a projection device that projects modulated light beam from the electro-optical device.

* * * * *

UNITED STATES PATENT AND TRADEMARK OFFICE
CERTIFICATE OF CORRECTION

PATENT NO. : 6,358,759 B1
DATED : March 19, 2002
INVENTOR(S) : Yukiya Hirabayashi It is certified that error appears in the above-identified patent and that said Letters Patent is hereby corrected as shown below:

<u>Title page,</u>
Insert Item [30] as follows: -- [30] Foreign Application Priority Data
July 7, 2000 (JP) ………………….. 2000-207079 --

Signed and Sealed this

Fifteenth Day of October, 2002

*Attest:*

*Attesting Officer*

JAMES E. ROGAN
*Director of the United States Patent and Trademark Office*